(12) United States Patent
Chung et al.

(10) Patent No.: US 10,453,698 B2
(45) Date of Patent: Oct. 22, 2019

(54) METHODS OF FABRICATING INTEGRATED CIRCUIT DEVICES

(71) Applicant: Samsung Electronics Co., Ltd., Suwon-si, Gyeonggi-do (KR)

(72) Inventors: Sang-gyo Chung, Anyang-si (KR); Yun-seung Kang, Seoul (KR); Soung-hee Lee, Hwaseong-si (KR); Ji-seung Lee, Seoul (KR); Hyun-chul Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/108,308

(22) Filed: Aug. 22, 2018

(65) Prior Publication Data

US 2019/0198339 A1 Jun. 27, 2019

(30) Foreign Application Priority Data

Dec. 26, 2017 (KR) .......................... 10-2017-0180130

(51) Int. Cl.
*H01L 21/308* (2006.01)
*G03F 7/20* (2006.01)
*H01L 21/033* (2006.01)
*H01L 21/02* (2006.01)

(52) U.S. Cl.
CPC ...... *H01L 21/3086* (2013.01); *G03F 7/70466* (2013.01); *H01L 21/02274* (2013.01); *H01L 21/0337* (2013.01); *H01L 21/0338* (2013.01); *H01L 21/3088* (2013.01)

(58) Field of Classification Search
USPC ........................................................ 438/717
See application file for complete search history.

(56) References Cited

U.S. PATENT DOCUMENTS

| 8,836,083 | B2 | 9/2014 | Zhou |
| 9,105,478 | B2 | 8/2015 | Wei et al. |
| 9,184,169 | B2 | 11/2015 | Kim et al. |
| 9,240,329 | B2 | 1/2016 | Devilliers |
| 9,324,570 | B1 * | 4/2016 | Liou ............... H01L 21/0337 |
| 9,704,974 | B2 | 7/2017 | Chang et al. |
| 2014/0017889 | A1 | 1/2014 | Lee et al. |
| 2016/0070848 | A1 | 3/2016 | Kang et al. |
| 2016/0211168 | A1 | 7/2016 | Park et al. |
| 2016/0233104 | A1 | 8/2016 | Kim et al. |

FOREIGN PATENT DOCUMENTS

| KR | 1020140008863 | 1/2014 |
| KR | 1020160028781 | 3/2016 |
| KR | 1020160090426 | 8/2016 |
| KR | 1020160097609 | 8/2016 |

* cited by examiner

Primary Examiner — Roberts P Culbert
(74) Attorney, Agent, or Firm — Myers Bigel, P.A.

(57) ABSTRACT

Methods of fabricating an integrated circuit device are provided. The methods may form feature patterns on a substrate using a quadruple patterning technology (QPT) process including one photolithography process and two double patterning processes. Sacrificial spacers obtained by first double patterning process and spacers obtained by second double patterning process may be formed on a feature layer at an equal level.

20 Claims, 27 Drawing Sheets

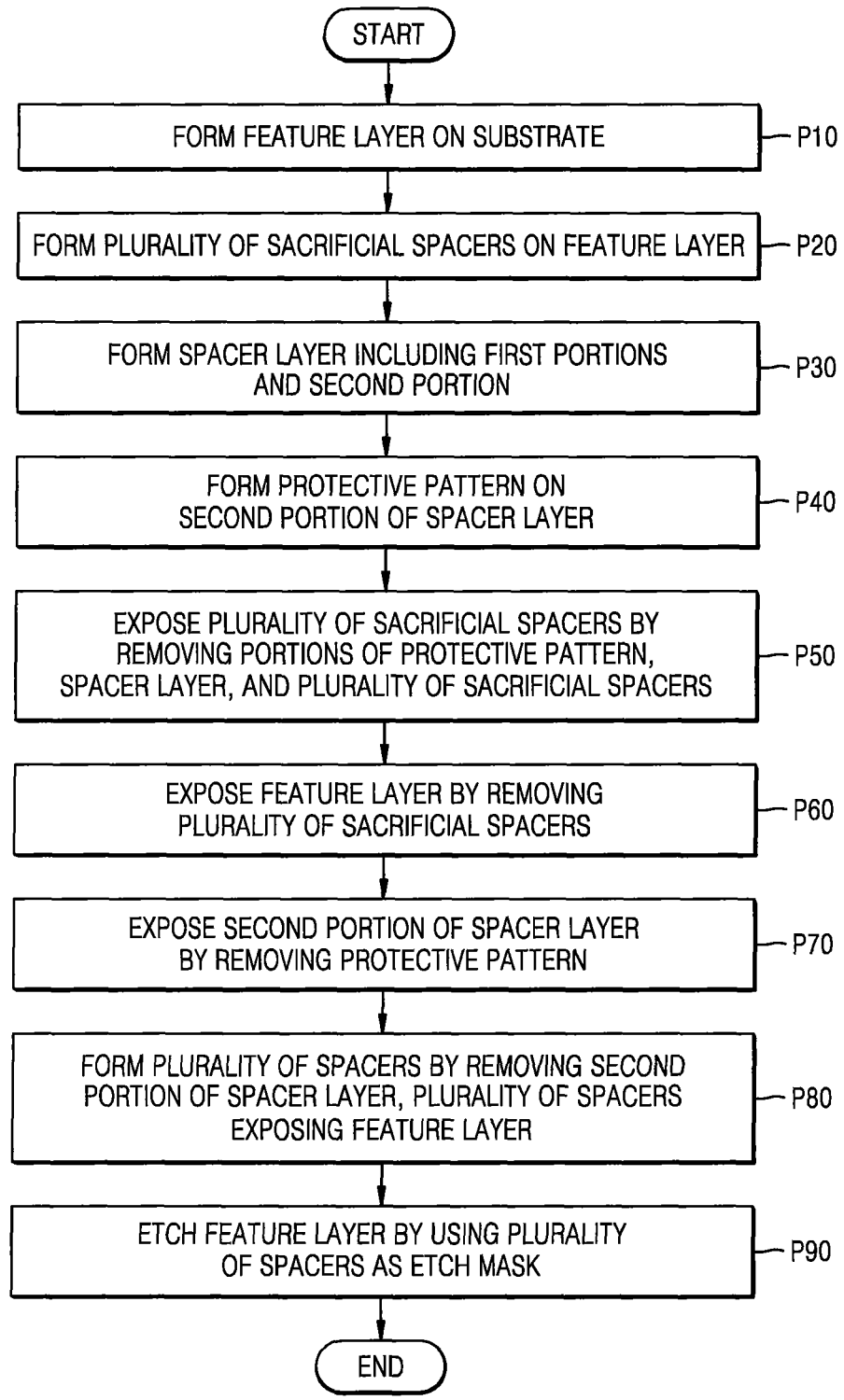

METHODS OF FABRICATING INTEGRATED CIRCUIT DEVICES

CROSS-REFERENCE TO RELATED APPLICATION

This U.S. non-provisional patent application claims priority under 35 U.S.C. § 119 to Korean Patent Application No. 10-2017-0180130, filed on Dec. 26, 2017, in the Korean Intellectual Property Office, the disclosure of which is incorporated herein in its entirety by reference.

BACKGROUND

The inventive concept generally relates to a method of fabricating an integrated circuit device, and more particularly, to a method of fabricating an integrated circuit device using a quadruple patterning technology (QPT) process.

Manufacturing integrated devices with high integration density may include forming fine patterns. To form a large number of devices in a small area, reducing sizes of individual devices may be beneficial, and thus reducing a pitch of patterns desired to be formed and a gap between the patterns may also be beneficial. As the design rules of semiconductor devices are rapidly reduced, forming fine patterns having fine pitches may not be easy due to a resolution limit in photolithography processes. Therefore, fabrication methods allowing fine patterns to be formed within a resolution limit in photolithography processes have been developed.

SUMMARY

Example embodiments of the inventive concept provides methods of fabricating an integrated circuit device, which allow high density patterns to be formed, by simplified processes, by using patterns having sizes implementable within a resolution limit in existing photolithography processes, even when the high density patterns have relatively small widths and relatively small pitches.

According to example embodiments of the inventive concept, methods of fabricating an integrated circuit device may include forming a layer including a first material on a substrate, and forming a pair of sacrificial spacers defining a sacrificial spacer recess between the pair of sacrificial spacers. The sacrificial spacer recess may expose a portion of the layer, and the pair of sacrificial spacers may include the first material. The methods may also include forming a spacer layer including a plurality of first portions and a second portion and forming a protective pattern overlapping the second portion of the spacer layer. Each of the plurality of first portions of the spacer layer may extend on a respective one of sidewalls of the pair of sacrificial spacers, and the second portion of the spacer layer may overlap the portion of the layer, and the spacer layer may include a second material that is different from the first material. The methods may further include removing upper portions of the protective pattern, upper portions of the spacer layer, and upper portions of the pair of sacrificial spacers to expose lower portions of the pair of sacrificial spacers, removing the lower portions of the pair of sacrificial spacers to expose a plurality of first etch regions of the layer while the protective pattern is overlapping the second portion of the spacer layer, removing the protective pattern to expose the second portion of the spacer layer, removing the second portion of the spacer layer to form a plurality of spacers and to expose a second etch region of the layer, and etching the layer by using the plurality of spacers as an etch mask. The plurality of spacers may expose a plurality of etch regions of the layer, and the plurality of etch regions of the layer may include the plurality of first etch regions and the second etch region of the layer.

According to example embodiments of the inventive concept, methods of fabricating an integrated circuit device may include forming a layer on a substrate, forming a plurality of sacrificial spacers on the layer, and forming a spacer layer including a plurality of first portions and a plurality of second portions. The plurality of sacrificial spacers may expose a plurality of portions of the layer. Each of the plurality of first portions may extend on a respective one of sidewalls of the plurality of sacrificial spacers, and each of the plurality of second portions may overlap one of the plurality of portions of the layer, and the spacer layer may define a plurality of spacer layer recesses, and one of the plurality of spacer layer recesses may be between two adjacent ones of the plurality of sacrificial spacers. The methods may also include forming a plurality of protective patterns in the plurality of spacer layer recesses, respectively, removing upper portions of the spacer layer to expose the plurality of sacrificial spacers while the plurality of protective patterns is overlapping the plurality of second portions of the spacer layer, respectively, removing the plurality of sacrificial spacers to expose a plurality of first etch regions of the layer, removing the plurality of protective patterns to expose the plurality of second portions of the spacer layer, removing the plurality of second portions of the spacer layer to expose a plurality of second etch regions of the layer to form a plurality of spacers, and etching the plurality of first etch regions and the plurality of second etch regions of the layer by using the plurality of spacers as an etch mask. Each of the plurality of protective patterns may overlap a respective one of the plurality of second portions of the spacer layer. The plurality of second etch regions may be spaced apart from the plurality of first etch regions, and each of the plurality of spacers may include a portion of a respective one of the plurality of first portions of the spacer layer.

According to example embodiments of the inventive concept, methods of fabricating an integrated circuit device may include forming a layer on a substrate. The layer may include a first portion formed on a first region of the substrate and a second portion formed on a second region of the substrate, and the layer may include a first material. The methods may also include forming a blocking film extending on the second portion of the layer and forming a plurality of sacrificial spacers on the first portion of the layer and a first covering layer on the second portion of the layer. The plurality of sacrificial spacers may be spaced apart from each other and may define a plurality of sacrificial spacer recesses exposing a plurality of exposed portions of the layer, respectively. The plurality of sacrificial spacers may include the first material, and the first covering layer may extend on at least a portion of the blocking film and may include the first material. Further the methods may include forming a spacer layer on the first portion of the layer and a second covering layer on the second portion of the layer. The spacer layer may include a plurality of first portions and a plurality of second portions. Each of the plurality of first portions of the spacer layer may extend on a respective one of sidewalls of the plurality of sacrificial spacers, and each of the plurality of second portions of the spacer layer may overlap a respective one of the plurality of exposed portions of the layer. The spacer layer may define a plurality of spacer layer recesses between two adjacent ones of the plurality of sacrificial spacers, and the second covering layer may extend on at least a portion of the first covering layer. The methods may also include forming a plurality of protective patterns in the plurality of spacer layer recesses, respectively, and one of the plurality of protective patterns may overlap one of the plurality of second portions of the spacer layer. The methods may include removing upper portions of the spacer layer while the plurality of protective patterns is overlapping the plurality of second portions of the spacer layer, removing the plurality of sacrificial spacers to expose a plurality of first etch regions of the layer, removing the plurality of protective patterns to expose the plurality of second portions of the spacer layer, and removing the plurality of second portions of the spacer layer to expose a plurality of second etch regions of the layer and to form a plurality of spacers. The plurality of second etch regions may be spaced apart from the plurality of first etch regions, and the plurality of spacers may include portions of the plurality of first portions of the spacer layer, respectively. Additionally, the methods may include etching the plurality of first etch regions and the plurality of second etch regions of the layer to form a plurality of patterns in the first region of the layer using the plurality of spacers as an etch mask while the blocking film is overlapping the second region of the layer.

Methods of fabricating the integrated circuit device may include a quadruple patterning technology (QPT) process including one photolithography process and two double patterning processes may be used to form a plurality of feature patterns on a substrate. A plurality of sacrificial spacers obtained by first double patterning and a plurality of spacers obtained by second double patterning are formed at an equal level on a feature layer. Since the methods may not include forming intermediate sacrificial layers, processes of forming the plurality of feature patterns may be simplified, and manufacturing costs may be reduced.

BRIEF DESCRIPTION OF THE DRAWINGS

Embodiments of the inventive concept will be more clearly understood from the following detailed description taken in conjunction with the accompanying drawings in which:

FIG. 1 is a flowchart of methods of fabricating an integrated circuit device, according to example embodiments of the present inventive concept;

FIG. 8A is a diagram illustrating a layout of a partial configuration of a memory cell array of a non-volatile memory device, and FIG. 8B is a perspective view of a partial configuration of the memory cell array of the non-volatile memory device.

DETAILED DESCRIPTION

Figure 2A:
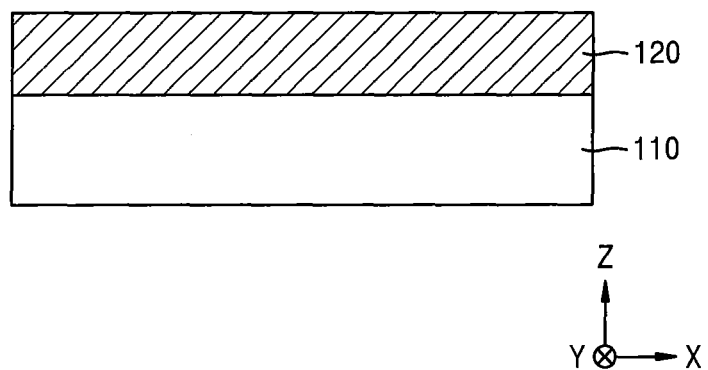
FIGS. 2A through 2N are cross-sectional views illustrating methods of fabricating an integrated circuit device, according to example embodiments of the present inventive concept.

Hereinafter, example embodiments of the present inventive concept will be described in detail with reference to the accompanying drawings. Like components will be denoted by like reference numerals throughout the specification, and repeated descriptions thereof may be omitted. As used herein the term "and/or" includes any and all combinations of one or more of the associated listed items.

It will be understood that "an element A covers a surface of an element B" (or similar language) means that the element A is on the surface of the element B but does not necessarily mean that the element A covers the surface of the element B entirely. It will be also understood that "formed simultaneously" (or similar language) refers to being formed in a same fabrication step, at approximately (but not necessarily exactly) the same time. Further, it will be understood that "pattern" may refer to a single element of a group of elements or may refer to a group of elements, but will not be limited thereto.

FIG. 1 is a flowchart of methods of fabricating an integrated circuit device, according to example embodiments of the present inventive concept.

Figure 2B:
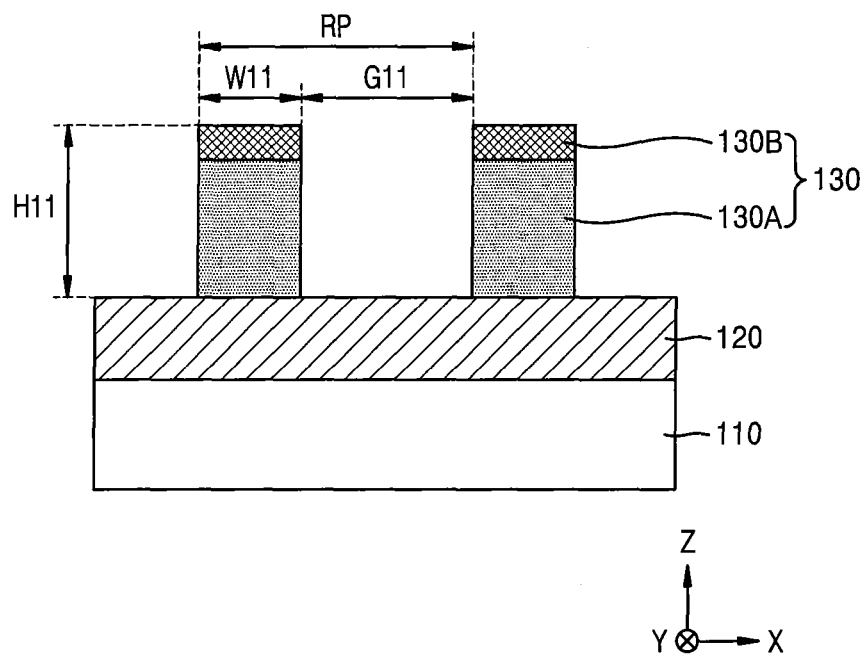
Figure 2C:
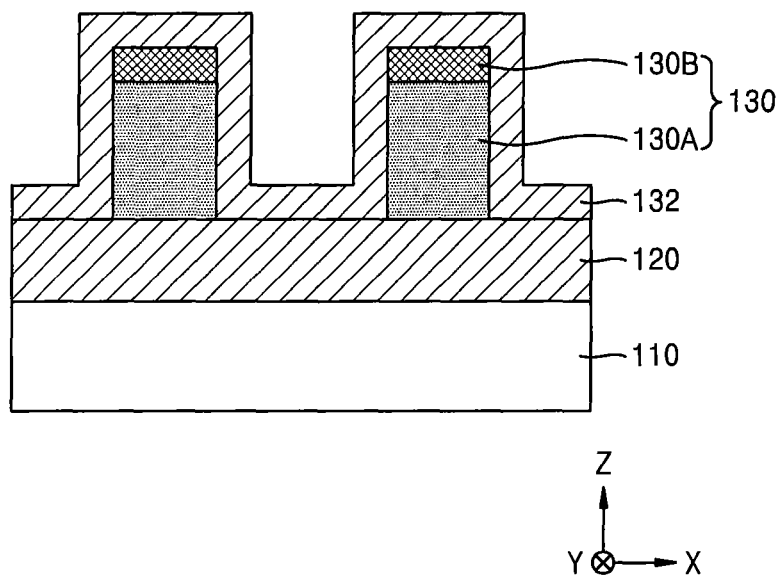
Figure 2D:
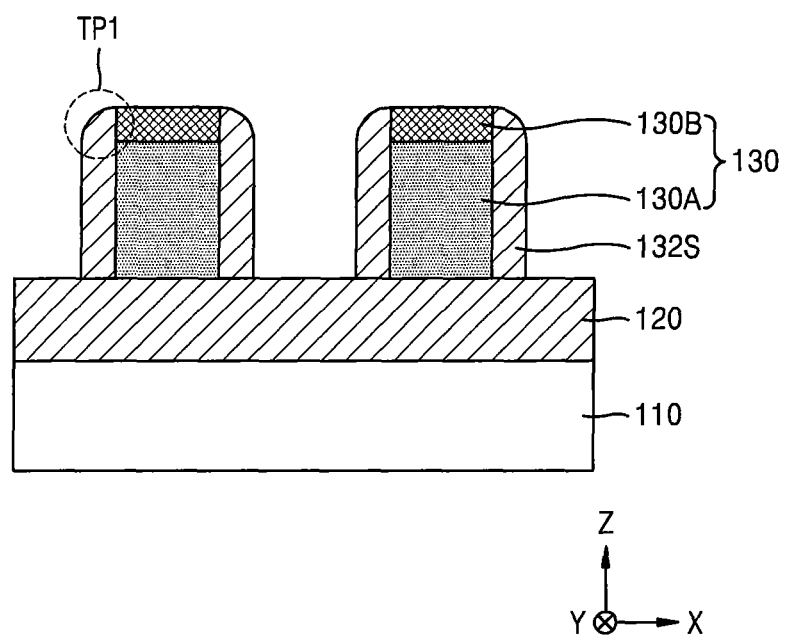
Figure 2E:
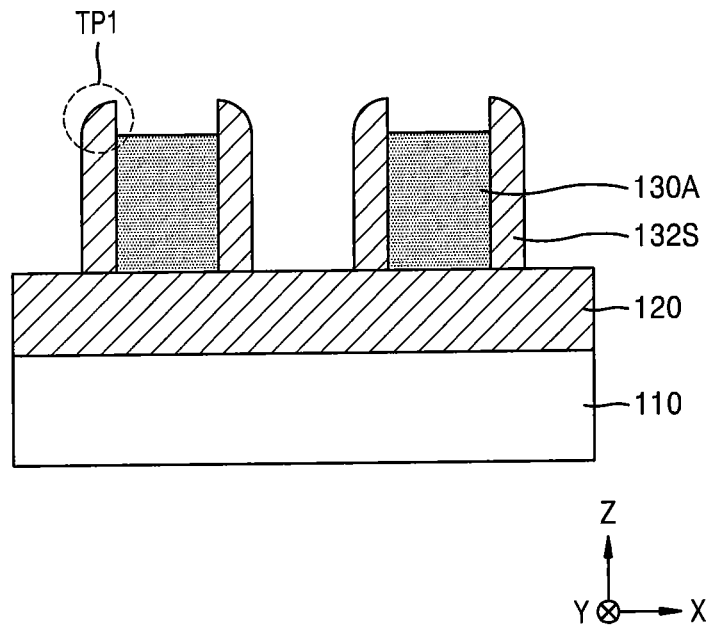
Figure 2F:
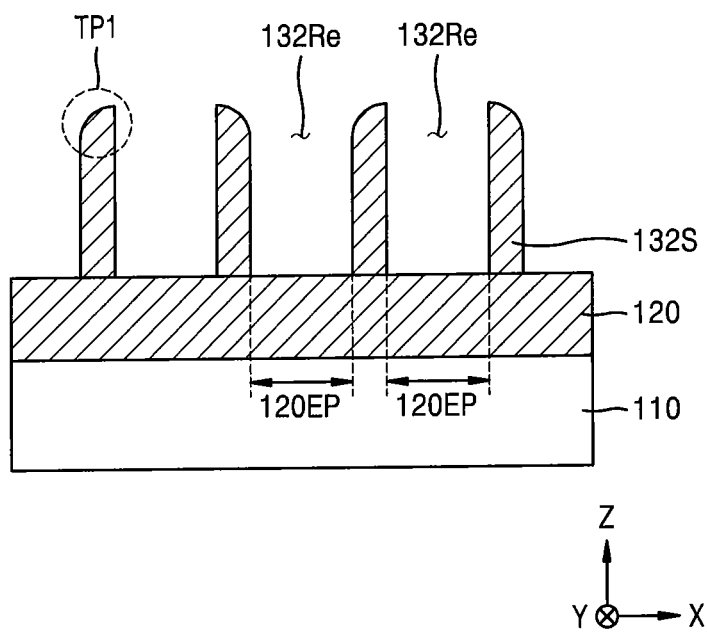
Figure 2G:
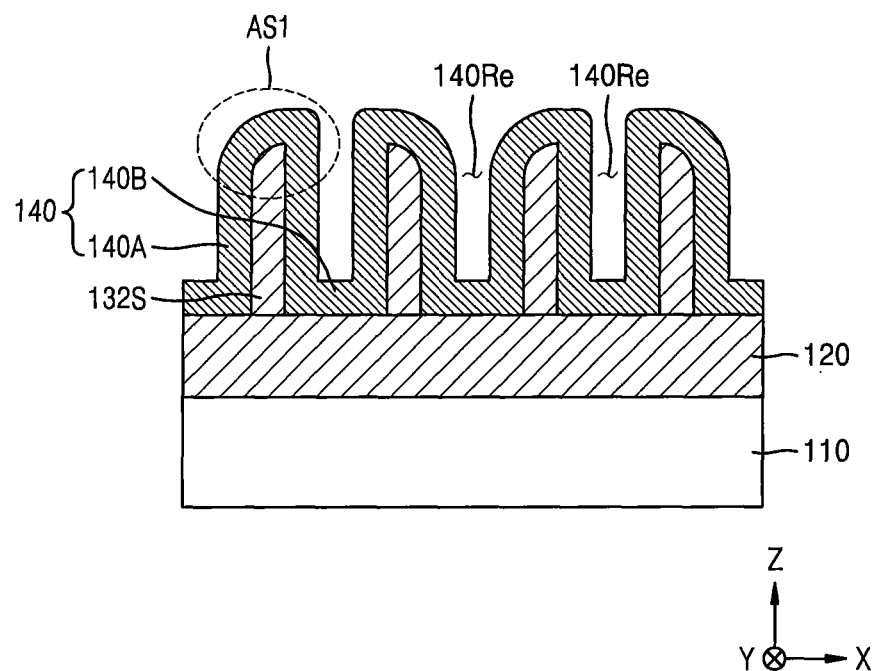
Figure 2H:
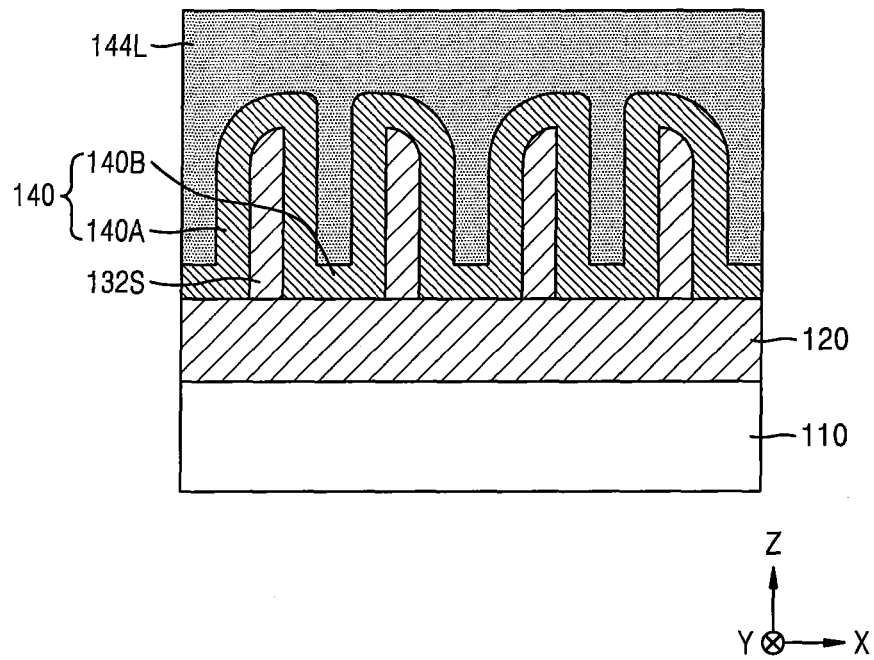
Figure 2I:
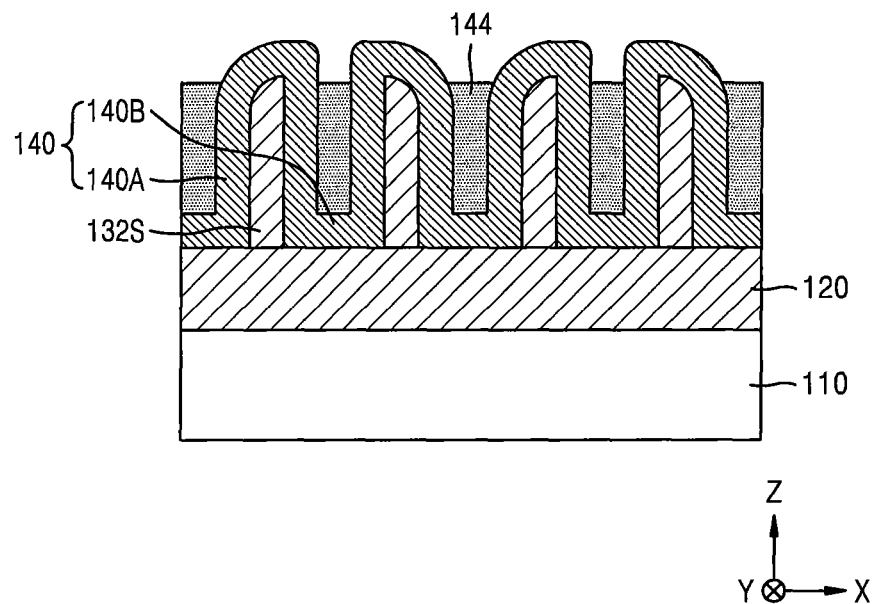
Figure 2J:
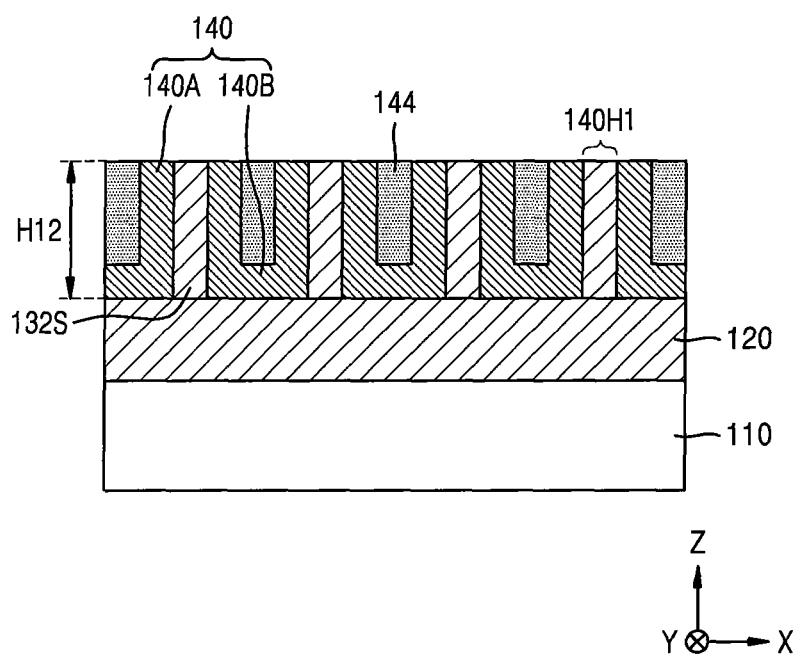
Figure 2K:
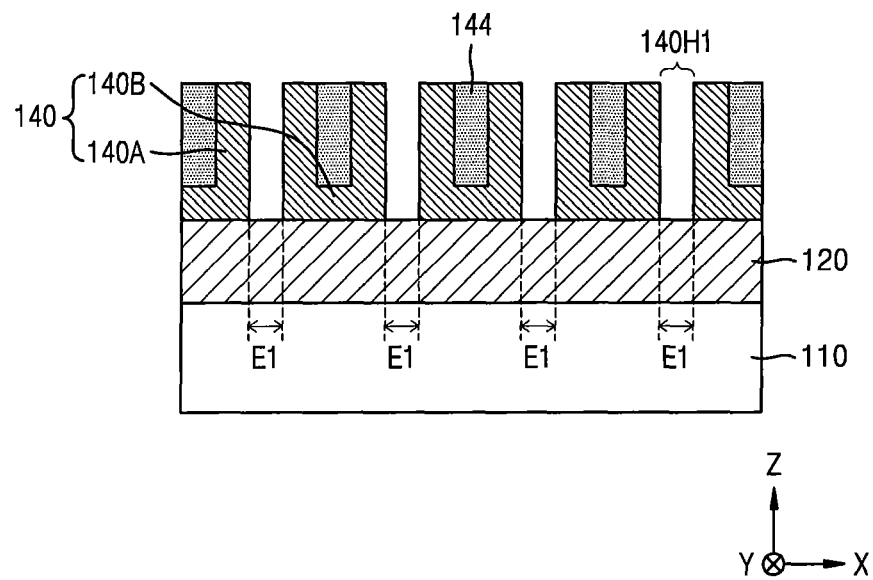
Figure 2L:
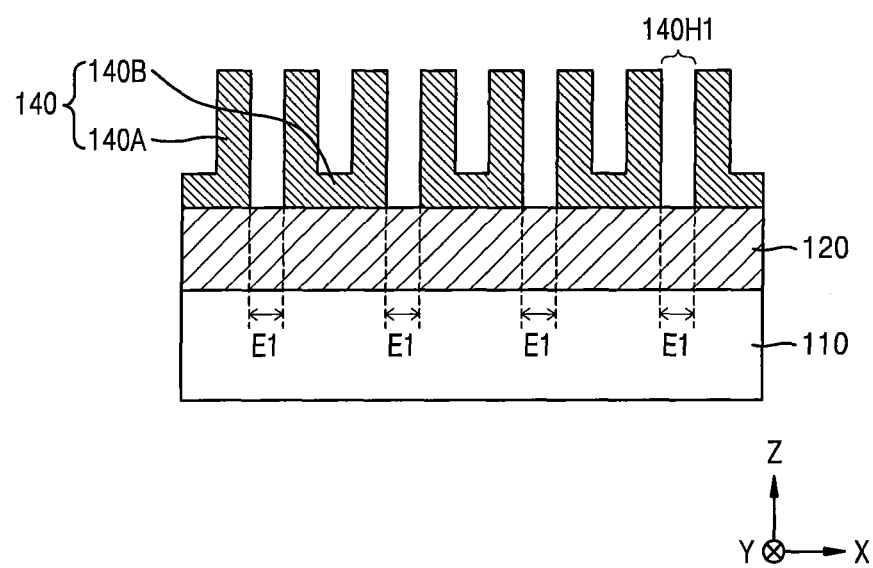
Figure 2M:
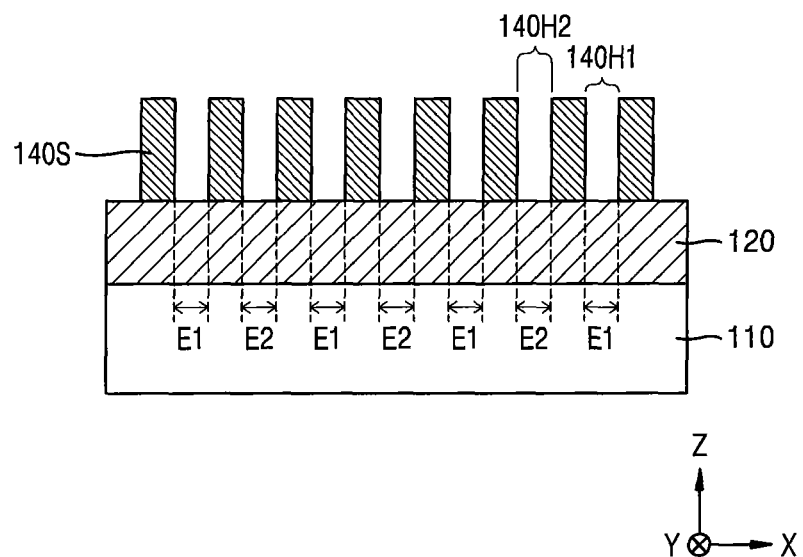
Figure 2N:
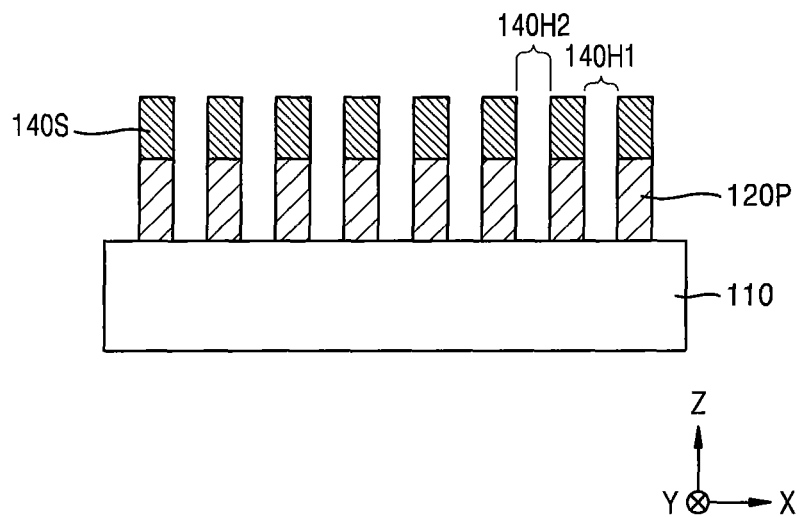

FIGS. 2A through 2N are cross-sectional views illustrating operations/processes of methods of fabricating an integrated circuit device, according to example embodiments of the present inventive concept. In some embodiments, the operations/processes described in FIGS. 2A through 2N may occur sequentially.

Methods of fabricating an integrated circuit device using a quadruple patterning technology (QPT) process will be described with reference to FIGS. 1 and 2A to 2N. The QPT process may include one photolithography process and two double patterning processes.

Referring to FIGS. 1 and 2A, in a process P10, a feature layer 120 is formed on a substrate 110. It will be understood that the feature layer 120 refers to a layer to be etched using QPT process according to some embodiments of the inventive concept.

The substrate 110 may include a semiconductor substrate. In some embodiments, the substrate 110 may include a semiconductor element such as Si and/or Ge. In some embodiments, the substrate 110 may include a compound semiconductor such as SiGe, SiC, GaAs, InAs, and/or InP. The substrate 110 may include a conductive region, for example, a region including impurities (e.g., an impurity-doped well, or an impurity-doped structure). The substrate 110 may have various device isolation structures such as a shallow trench isolation (STI) structure. The feature layer 120 may include, for example, an oxide film, a nitride film, or a polysilicon film, without being limited thereto.

Referring to FIG. 1 and FIGS. 2B through 2F, in a process P20, a plurality of sacrificial spacers 132S are formed on the feature layer 120. Each of the plurality of sacrificial spacers 132S may be formed directly on the feature layer 120 to contact a top surface of the feature layer 120. In some embodiments, each of the plurality of sacrificial spacers 132S directly contacts an upper surface of the feature layer 120 as illustrated in FIG. 2B.

As shown in FIG. 2B, a plurality of reference patterns 130 may be formed on the feature layer 120, the plurality of reference patterns 130 being repeatedly formed at a certain reference pitch RP in a first direction (e.g., a X direction). It will be understood that the first direction is a horizontal direction parallel to an upper surface of the substrate 110.

The plurality of reference patterns 130 may include a material having an etch selectivity with respect to the feature layer 120 and a sacrificial spacer layer 132 that will be described with reference to FIG. 2C. Each of the plurality of reference patterns 130 may include a stack structure including a carbon-containing film 130A and an etch stop film 130B. In some embodiments, the carbon-containing film 130A may include a spin-on hardmask (SOH) material. The SOH material may include a hydrocarbon compound and/or derivatives thereof having a relatively high carbon content of, for example, about 85% by weight (wt %) to about 99 wt % based on a total weight of the SOH material. The etch stop film 130B may include a SiON film. However, the inventive concept is not limited to the example materials set forth above, and each of the carbon-containing film 130A and the etch stop film 130B may include various materials.

In some embodiments, to form the plurality of reference patterns 130, a carbon-containing film and a SiON film may be stacked first on an entire surface of the feature layer 120 in this stated order, followed by patterning the carbon-containing film and the SiON film by a photolithography process.

A width W11 of each of the plurality of reference patterns 130 in the first direction (e.g., the X direction) may be determined by taking into account process deviations in subsequent processes. In some embodiments, when a minimum feature size in the first direction (e.g., the X direction) is 1F, the reference pitch RP may be 8F. In some embodiments, when the reference pitch RP is 8F, the width W11 of each of the plurality of reference patterns 130 may be set as 3 F. In some embodiments, when the reference pitch RP is 8F, the width W11 of each of the plurality of reference patterns 130 may be set to be greater than 3F considering process deviations in subsequent processes. For example, when a width of each of the plurality of sacrificial spacers 132S in the X direction is 1F, which will be described with reference to FIG. 2D, the width W11 of each of the plurality of reference patterns 130 may be at least 3F, and a gap Gil (e.g., a distance in the X direction) between the plurality of reference patterns 130 may be at least 5F. In some embodiments, the width W11 of each of the plurality of reference patterns 130 may have a dimension of several nanometers to several tens of nanometers.

Each of the plurality of reference patterns 130 may have a first height H11 in a vertical direction (e.g., a Z direction) from the top surface of the feature layer 120. It will be understood that the vertical direction is perpendicular to an upper surface of the substrate 110.

Referring to FIG. 2C, a sacrificial spacer layer 132 is formed. In some embodiments, the sacrificial spacer layer 132 may conformally extend on (e.g., conformally cover) both opposing sidewalls of each of the plurality of reference patterns 130 and the top surface of the feature layer 120, as illustrated in FIG. 2C. In some embodiments, the sacrificial spacer layer 132 may have a uniform thickness along both opposing sidewalls of each of the plurality of reference patterns 130 and the top surface of the feature layer 120, as illustrated in FIG. 2C.

The feature layer 120 may include an oxide film, a nitride film, and/or a polysilicon film, without being limited thereto. A material constituting the sacrificial spacer layer 132 may be substantially identical to a material constituting the feature layer 120. For example, each of the sacrificial spacer layer 132 and the feature layer 120 may include a silicon oxide film. In some embodiments, to form the sacrificial spacer layer 132, an atomic layer deposition (ALD) process may be used.

Referring to FIG. 2D, the sacrificial spacer layer 132 (see FIG. 2C) is etched back, thereby leaving the plurality of sacrificial spacers 132S, which are portions of the sacrificial spacer layer 132. The portions of the sacrificial spacer layer 132 may cover both sidewalls of each of the plurality of reference patterns 130.

An upper end TP1 of each of the plurality of sacrificial spacers 132S may have both sidewalls having asymmetrical cross-sectional profiles in the X direction. For example, among both sidewalls of the upper end TP1 of each of sacrificial spacer 132S, a sidewall facing a sidewall of each reference pattern 130 may be a vertical sidewall extending in an approximately vertical direction (e.g., a Z direction) with respect to an extension direction of the substrate 110 (for example, an extension direction of an X-Y plane). On the other hand, a sidewall at an opposite side to the sidewall facing the sidewall of each reference pattern 130 may be a sidewall having a shape allowing an end of each sacrificial spacer 132S to have a gradually decreasing width in the X direction as a distance from the substrate 110 increases, the end being far away from the substrate 110. In some embodiments, the upper end TP1 of each of sacrificial spacer 132S may be tapered upwardly as illustrated in FIG. 2C.

Referring to FIG. 2E, the etch stop film 130B of each of the plurality of reference patterns 130 is selectively removed from a result product of FIG. 2D, thereby exposing the carbon-containing film 130A.

In some embodiments, when each of the feature layer 120 and the plurality of sacrificial spacers 132S includes a silicon oxide film, and the etch stop film 130B may include an SiON film, to reduce (e.g., suppress) the consumption of the feature layer 120 and the plurality of sacrificial spacers 132S as much as possible during the removal of the etch stop film 130B. The etch stop film 130B may be selectively etched by using an etching gas including $CH_3F$ gas and $O_2$ gas. For example, the result product of FIG. 2D may be loaded into an etching chamber of a plasma etcher, followed by performing a plasma etching process of the etch stop film 130B while $CH_3F$ gas and $O_2$ gas are supplied into the etching chamber in a volume ratio of about 2:1 by using Ar gas. By performing such an etching process, the consumption of the feature layer 120 and the plurality of sacrificial spacers 132S, which are also exposed to the etching atmosphere during the etching of the etch stop film 130B, may be reduced (e.g., suppressed), and thus, the precision of pattern formation may be improved.

Referring to FIG. 2F, the carbon-containing film 130A may be removed from a result product of FIG. 2E, thereby exposing portions of the top surface of the feature layer 120, the portions having been covered with the plurality of reference patterns 130. In some embodiments, the plurality of sacrificial spacers 132S may define a plurality of sacrificial spacer recesses 132Re, and the plurality of sacrificial spacer recesses 132Re may expose portions 120EP of the feature layer 120, respectively, as illustrated in FIG. 2F.

When the carbon-containing film 130A includes an SOH material, an ashing process and a stripping process may be used to remove the carbon-containing film 130A.

Referring to FIGS. 1 and 2G, in a process P30, a spacer layer 140 including first portions 140A and second portions 140B is formed, the first portions 140A extending on (e.g., covering) both sidewalls of each of the plurality of sacrificial spacers 132S, and the second portions 140B extending on (e.g., covering), respectively, portions of the feature layer 120 between the plurality of sacrificial spacers 132S. In some embodiments, the spacer layer 140 may define a plurality of spacer layer recesses 140Re, as illustrated in FIG. 2G.

The spacer layer 140 may include a material different from a material constituting each of the feature layer 120 and the plurality of sacrificial spacers 132S. For example, when each of the feature layer 120 and the plurality of sacrificial spacers 132S includes a silicon oxide film, the spacer layer 140 may include polysilicon.

The spacer layer 140 may be formed to conformally extend on (e.g., cover) sidewalls and top surfaces of the plurality of sacrificial spacers 132S and portions of the top surface of the feature layer 120. In some embodiments, the first portions 140A and the second portions 140B of the spacer layer 140 may have a substantially equal thickness.

As described with reference to FIG. 2D, since both sidewalls of each of the plurality of sacrificial spacers 132S are asymmetrical with respect to each other, an upper portion AS1 of the spacer layer 140 covering the plurality of sacrificial spacers 132S may have asymmetrical outer sidewalls at both sides with respect to one sacrificial spacer 132S, the upper portion AS1 covering the asymmetrically-shaped upper end TP1 of each of the plurality of sacrificial spacers 132S.

To form a spacer covering both sidewalls of each of the plurality of sacrificial spacers 132S, if the spacer layer 140, in which the upper portion AS1 has an asymmetrical shape, is etched back as it is, since etching amounts of portions of the spacer layer 140, which cover both sidewalls of one sacrificial spacer 132S, may be different from each other, a pair of spacers remaining, as a result product of etch-back of the spacer layer 140, at both sides with respect to the one sacrificial spacer 132S may have sizes and widths different from each other, and there may occur a critical dimension (CD) deviation in a final pattern remaining on the substrate 110 through subsequent etching processes using the pair of spacers set forth above.

In the method of fabricating the integrated circuit device according to the inventive concept, to reduce (e.g., suppress) a CD deviation which may caused by the spacer layer 140 including the upper portion AS1 having an asymmetrical shape, a process P50 of FIG. 1 and a process described below with reference to FIG. 2I may be performed.

Referring to FIGS. 1, 2H, and 2I, in a process P40, a protective pattern 144 may be formed. The protective pattern 144 may extend on (e.g., may cover) the second portion 140B of the spacer layer 140. In some embodiments, the protective pattern 144 may be formed in (e.g., may completely fill) the plurality of spacer layer recesses 140Re, as illustrated in FIG. 2H.

More specifically, as shown in FIG. 2H, a protective film 144L may be formed on a result product of FIG. 2F, on which the spacer layer 140 is formed.

The protective film 144L may include a carbon-containing film. For example, the protective film 144L may include an SOH material. To form the protective film 144L, a spin coating process may be used. The protective film 144L may include portions, which are formed in (e.g., partially fill, completely fill) spaces between the plurality of sacrificial spacers 132S. The protective film 144L may include a material identical to a material constituting the carbon-containing film 130A (see FIG. 2B).

In some embodiments, the protective film 144L may fill the spaces between the plurality of sacrificial spacers 132S, and thus the portions in the spaces may be referred to as filling portions. In some embodiments, the protective film 144L may be formed in the plurality of spacer layer recesses 140Re, as illustrated in FIG. 2H and may include an upper portion formed on the spacer layer 140.

Referring to FIG. 2I, the protective film 144L may be partially removed from a top surface thereof by etch-back such that only the filling portions that are between (e.g., fill) the spaces between the plurality of sacrificial spacers 132S remain. As a result, a plurality of protective patterns 144, which include the filling portions of the protective film 144L, may be obtained, the filling portions each being on the second portion 140B of the spacer layer 140 and being in (e.g., filling) the spaces between the plurality of sacrificial spacers 132S. In some embodiments, an upper portion of the protective film 144L may be removed to form a plurality of protective patterns 144 that are in (e.g., completely fill) the plurality of spacer layer recesses 140Re, respectively, as illustrated in FIG. 2I. In some embodiments, upper surfaces of the plurality of protective patterns 144 may be lower than uppermost surfaces of the spacer layer 140, as illustrated in FIG. 2I.

Referring to FIGS. 1 and 2J, in the process P50, respective heights of the protective pattern 144, the spacer layer 140, and the plurality of sacrificial spacers 132S are reduced by a dry etching process. As a result, the plurality of sacrificial spacers 132S are exposed, and the upper end TP1 of each of the plurality of sacrificial spacers 132S and the upper portion AS1 of the spacer layer 140 are removed, whereby portions causing a CD deviation in subsequent processes may not remain over the substrate 110 (e.g., may be removed).

In some embodiments, to reduce the respective heights of the protective pattern 144, the spacer layer 140, and the plurality of sacrificial spacers 132S, an etch process (e.g., an etch-back process) may be performed on an entire surface of a result product of FIG. 2I under the condition that there is a small difference or no difference in etch selectivity between the protective pattern 144, the spacer layer 140, and the plurality of sacrificial spacers 132S. In some embodiments, to reduce the respective heights of the protective pattern 144, the spacer layer 140, and the plurality of sacrificial spacers 132S, the protective pattern 144, the spacer layer 140, and the plurality of sacrificial spacers 132S may be respectively etched back by separate etching processes. For example, in a result product of FIG. 2H, by etching the spacer layer 140 exposed between the plurality of protective patterns 144, a plurality of first openings 140H1 exposing the plurality of sacrificial spacers 132S may be formed while the height of the spacer layer 140 is reduced, and the plurality of sacrificial spacers 132S and the plurality of protective patterns 144, which are exposed as a result, may be simultaneously or sequentially etched, thereby reducing the respective heights of the plurality of sacrificial spacers 132S and the plurality of protective patterns 144.

In some embodiments, upper portions of the spacer layer 140 exposed by the protective pattern 144 and upper portions of the plurality of sacrificial spacers 132S may be removed, for example, by performing an etch process, as illustrated in FIG. 2J. In some embodiments, upper surfaces of the protective pattern 144, upper surfaces of the spacer layers 140, and upper surfaces of the plurality of sacrificial spacers 132S may be coplanar after removing the upper portions of the spacer layer 140 exposed by the protective pattern 144 and the upper portions of the plurality of sacrificial spacers 132S, as illustrated in FIG. 2J.

During the etching of the spacer layer 140, the second portion 140B of the spacer layer 140 may be protected by the protective pattern 144 such that the second portion 140B is not affected by an etching atmosphere.

During the etching of the spacer layer 140, if the second portion 140B of the spacer layer 140, instead of being covered with the protective pattern 144, is exposed to the etching atmosphere for forming the plurality of first openings 140H1, the second portion 140B may also be etched during the formation of the plurality of first openings 140H1. In some embodiments, since the feature layer 120 under the second portion 140B may also be exposed, defects such as pitting may be generated on the top surface of the feature layer 120. In addition, during the formation of the plurality of first openings 140H1, even though the feature layer 120 under the second portion 140B is not exposed, if the second portion 140B is etched and thus reduced in thickness, since the feature layer 120 under the second portion 140B as well as the second portion 140B is etched due to the reduced thickness of the second portion 140B when the second portion 140B is etched to form the a plurality of spacers 140S, as described with reference to FIG. 2M, defects such as pitting may be generated on the top surface of the feature layer 120, or in severe cases, the substrate 110 may also be etched and thus may cause a process fault.

However, according to the method of fabricating the integrated circuit device, according to the inventive concept, while the spacer layer 140 is etched to form the plurality of first openings 140H1 exposing the plurality of sacrificial spacers 132S, since the second portion 140B of the spacer layer 140 may be protected by the protective pattern 144, the occurrence of a process fault, such as the generation of pitting defects in the feature layer 120, may be reduced or possibly be prevented, as described above.

In some embodiments, after the respective heights of the protective pattern 144, the spacer layer 140, and the plurality of sacrificial spacers 132S are reduced such that the plurality of sacrificial spacers 132S are exposed, respective exposed top surfaces of the protective pattern 144, the spacer layer 140, and the plurality of sacrificial spacers 132S may form one plane (e.g., may be coplanar).

After the respective heights of the protective pattern 144, the spacer layer 140, and the plurality of sacrificial spacers 132S are reduced, and the plurality of sacrificial spacers 132S are exposed, the spacer layer 140 may have a second height H12 that is less (e.g., shorter) than the first height H11 (see FIG. 2B) of each of the plurality of reference patterns 130. In some embodiments, a difference between the first height H11 and the second height H12 may be at least 150 Å. For example, the difference between the first height Hl1 and the second height H12 may range from about 150 Å to about 300 Å.

Referring to FIGS. 1 and 2K, in a process P60, the plurality of sacrificial spacers 132S are removed through the plurality of first openings 140H1 while each of a plurality of second portions 140B included in the spacer layer 140 are covered with respective ones of the protective patterns 144, thereby exposing a plurality of first etch regions E1 of the feature layer 120 to the plurality of first openings 140H1. In some embodiments, the plurality of sacrificial spacers 132S may be removed to expose a plurality of first etch regions E1 of the feature layer 120, as illustrated in FIG. 2K. In some embodiments, each of the protective patterns 144 overlaps one of the plurality of second portions 140B of the spacer layer 140 while removing the plurality of sacrificial spacers 132S, as illustrated in FIG. 2K.

Referring to FIGS. 1 and 2L, in a process P70, the plurality of protective patterns 144 (see FIG. 2K) are removed, thereby exposing a plurality of second portions 140B of the spacer layer 140.

Referring to FIGS. 1 and 2M, in a process P80, the plurality of second portions 140B included in the spacer layer 140 are removed, thereby forming a plurality of second openings 140H2, which expose a plurality of second etch regions E2 of the feature layer 120, and simultaneously forming the plurality of spacers 140S, which include the plurality of first portions 140A included in the spacer layer 140, the plurality of second etch regions E2 being apart from the plurality of first etch regions E1.

To remove the plurality of second portions 140B included in the spacer layer 140, the spacer layer 140 may be etched (e.g., may be etched back). While the spacer layer 140 is etched to remove the plurality of second portions 140B, upper portions of the plurality of first portions 140A of the spacer layer 140 may also be etched, and a height of each of the plurality of spacers 140S obtained as a result may be less (e.g., shorter) than a height of each of the plurality of first portions 140A shown in FIG. 2L.

Referring to FIGS. 1 and 2N, in a process P90, the plurality of first etch regions E1 and the plurality of second etch regions E2 of the feature layer 120 are etched by using the plurality of spacers 140S as an etch mask, thereby forming a plurality of feature patterns 120P.

In some embodiments, a top surface of each of the plurality of feature patterns 120P may be exposed by removing the plurality of spacers 140S.

In some embodiments, processes P40 to P90 of FIG. 1, that is, a series of processes described with reference to FIGS. 2I to 2N, may be performed in situ in one chamber (e.g., a single chamber) without breaking a vacuum.

According to the methods of fabricating an integrated circuit device according to the inventive concept, which have been described with reference to FIGS. 1 and 2A to 2N to form the plurality of feature patterns 120P on the substrate 110, a QPT process including one photolithography process and two double patterning processes is used, and here, the plurality of sacrificial spacers 132S obtained by first double patterning and the plurality of spacers 140S obtained by second double patterning are formed at an equal level on the feature layer 120. In some embodiments, the plurality of spacers 140S that are used as an etch mask while etching the feature layer 120 may include upper surfaces that are coplanar with each other and have an equal height as illustrated in FIG. 2M.

If a plurality of sacrificial spacers obtained by first double patterning and a plurality of spacers obtained by second double patterning are formed at different levels from each other over a substrate, a plurality of intermediate sacrificial films that are used as pattern transfer films may be formed at an intermediate level between the different levels. According to methods of fabricating the integrated circuit device, however, since the plurality of sacrificial spacers 132S and the plurality of spacers 140S are formed at an equal level on the feature layer 120, a plurality of intermediate sacrificial films may not be needed. Therefore, the methods of fabricating the integrated circuit device according to the inventive concept may form the plurality of feature patterns 120P having fine widths by simplified processes, and manufacturing costs associated with the processes may be reduced, even when the plurality of feature patterns 120P is repeatedly formed on the substrate 110 at fine pitches beyond a resolution limit in a photolithography process.

According to some embodiments of the present inventive concept, the plurality of spacers 140S that have upper surfaces disposed at an equal level (e.g., coplanar with each other) and are used as an etch mask while etching the feature layer 120 may be formed without using intermediate sacrificial films.

FIGS. 3A through 3H are cross-sectional views illustrating methods of fabricating an integrated circuit device according to some embodiments of the inventive concept. In FIGS. 3A to 3H, the same reference numerals as in FIGS. 2A to 2N respectively denote the same or similar elements, and descriptions thereof may be omitted.

Figure 3A:
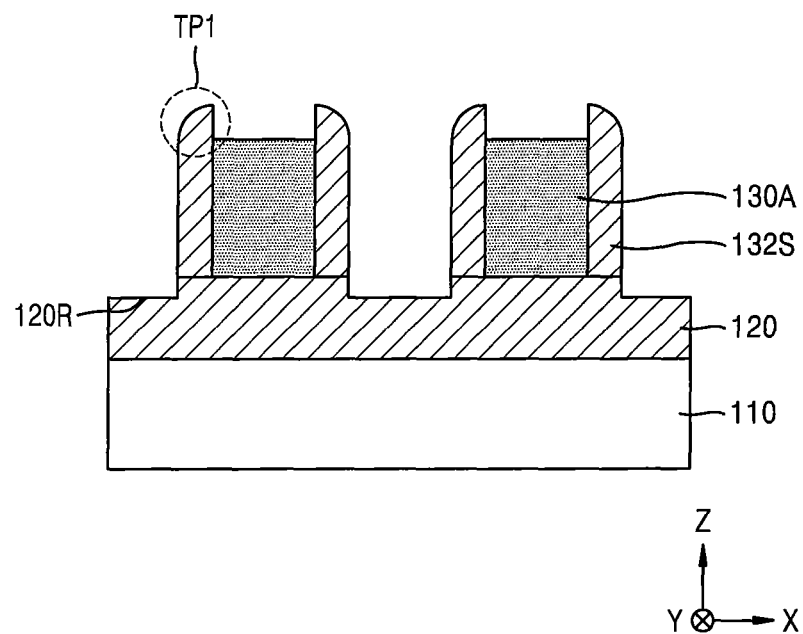
FIGS. 3A through 3H are cross-sectional views illustrating methods of fabricating an integrated circuit device, according to example embodiments of the present inventive concept.

Referring to FIG. 3A, the processes described with reference to FIGS. 2A to 2E are performed, thereby forming a plurality of carbon-containing films 130A and the plurality of sacrificial spacers 132S on the feature layer 120 that is formed on the substrate 110, and the plurality of sacrificial spacers 132S covering both sidewalls of each of the plurality of carbon-containing films 130A. In some embodiments, while performing the etch process (e.g., etch-back process) on the sacrificial spacer layer 132 as described with reference to FIG. 2D or while performing the etching process for removing the etch stop film 130B as described with reference to FIG. 2E, over-etch is performed thereby forming a recess 120R in a surface of the feature layer 120 exposed between the plurality of carbon-containing films 130A. As a result, a plurality of recesses 120R having a plurality of steps may be formed in the top surface of the feature layer 120.

Figure 3B:
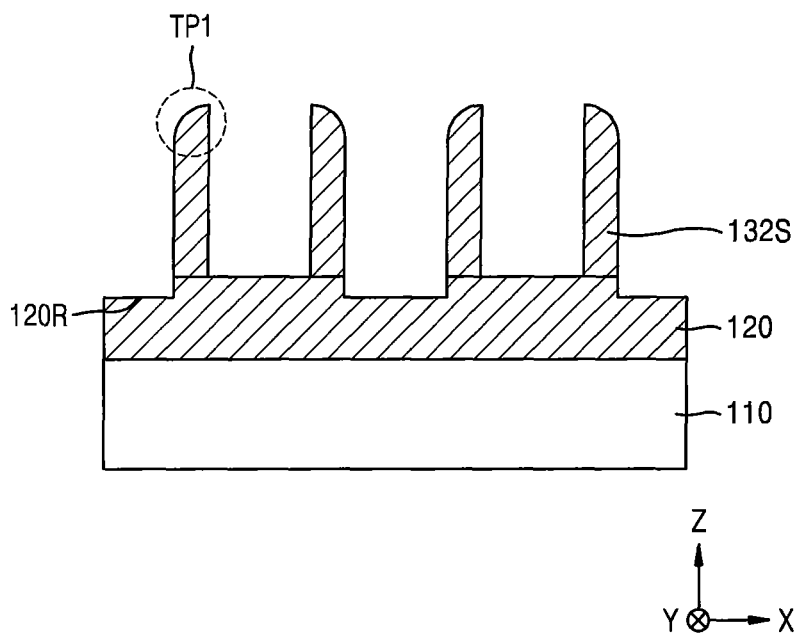

Referring to FIG. 3B, the plurality of carbon-containing films 130A are removed in the same or similar manner as described with reference to FIG. 2F.

Figure 3C:
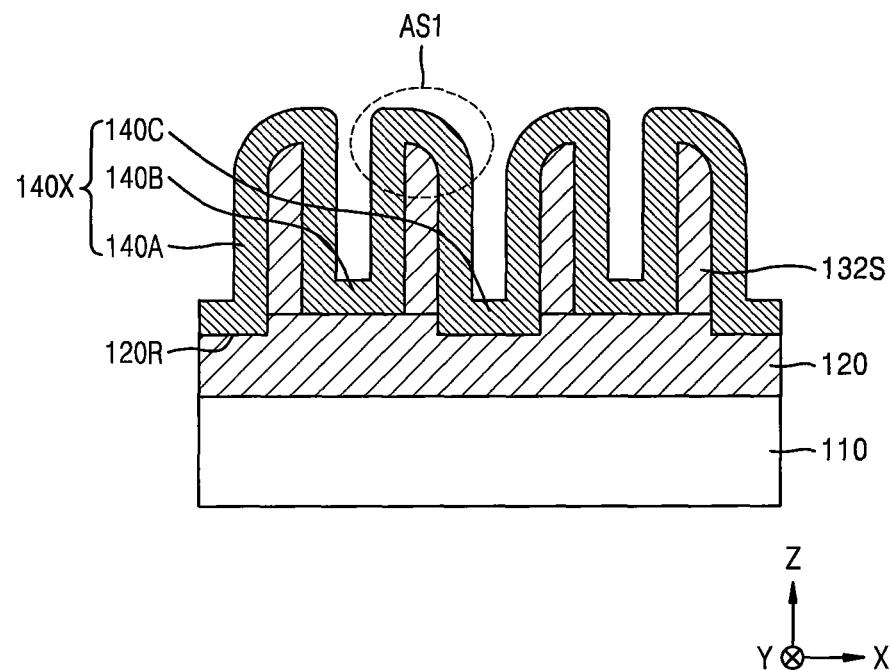

Referring to FIG. 3C, in the same or similar manner as described with reference to FIG. 2G regarding a method of forming the spacer layer 140, a spacer layer 140X is formed, which covers the plurality of sacrificial spacers 132S and the feature layer 120.

The spacer layer 140X may include the first portions 140A covering both sidewalls of each of the plurality of sacrificial spacers 132S, the second portion 140B covering a portion of the top surface of the feature layer 120, which may be at a relatively high level and a third portion 140C covering the recess 120R of the feature layer 120. A bottom surface of the third portion 140C of the spacer layer 140X may be closer to the substrate 110 than a bottom surface of the second portion 140B, as illustrated in FIG. 3D.

In some embodiments, the first portions 140A, the second portion 140B, and the third portion 140C of the spacer layer 140X may have a substantially equal thickness. Since both sidewalls of the upper end TP1 (see FIG. 3A) of each of the plurality of sacrificial spacers 132S are asymmetrical with respect to each other, the upper portion AS1 of the spacer layer 140X, which covers the upper end TP1 of each of the plurality of sacrificial spacers 132S may have asymmetrical outer sidewalls at both sides with respect to one sacrificial spacer 132S. More detailed configurations of the spacer layer 140X are the same as those described regarding the spacer layer 140 with reference to FIG. 2G.

Figure 3D:
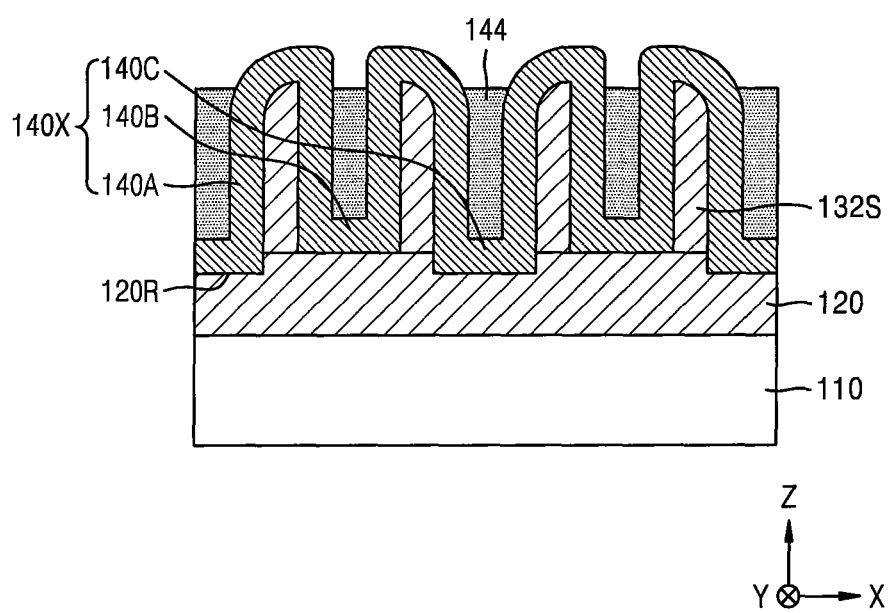

Referring to FIG. 3D, in a similar manner to that described with reference to FIGS. 2H and 2I, the protective pattern 144 is formed, and the protective pattern 144 may cover the second portion 140B and the third portion 140C of the spacer layer 140X.

Figure 3E:
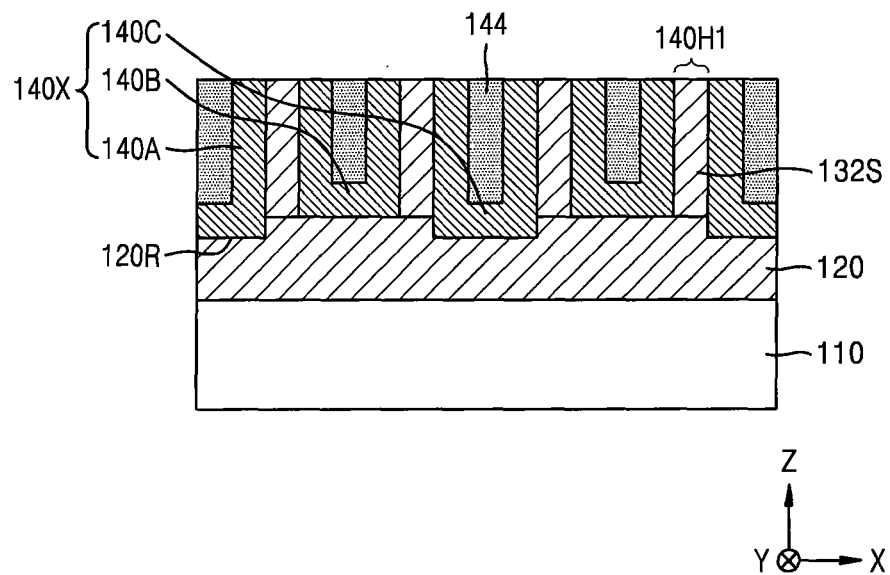

Referring to FIG. 3E, in a similar manner to that described with reference to FIG. 2J, the respective heights of the protective pattern 144, the spacer layer 140X, and the plurality of sacrificial spacers 132S are reduced, and the plurality of first openings 140H1 are formed in the spacer layer 140X. The plurality of first openings 140H1 may expose the plurality of sacrificial spacers 132S. In some embodiments, upper surfaces of the plurality of sacrificial spacers 132S may be exposed as illustrated in FIG. 3E.

By reducing the respective heights of the protective pattern 144, the spacer layer 140X, and the plurality of sacrificial spacers 132S, the upper end TP1 of each of the plurality of sacrificial spacers 132S, and the upper portion AS1 of the spacer layer 140X are removed, thereby portions causing a CD deviation in a subsequent process may not remain over the substrate 110.

While the spacer layer 140X is etched to reduce the respective heights of the protective pattern 144, the spacer layer 140X, and the plurality of sacrificial spacers 132S and to form the plurality of first openings 140H1, the second portion 140B and the third portion 140C of the spacer layer 140X may be covered by and protected by the protective pattern 144 such that the second portion 140B and the third portion 140C are not affected by an etching atmosphere (e.g., may not be etched). Therefore, a process fault, such as pitting defects around the spacer layer 140X, may be reduced or possibly prevented during the etching of the spacer layer 140X.

Figure 3F:
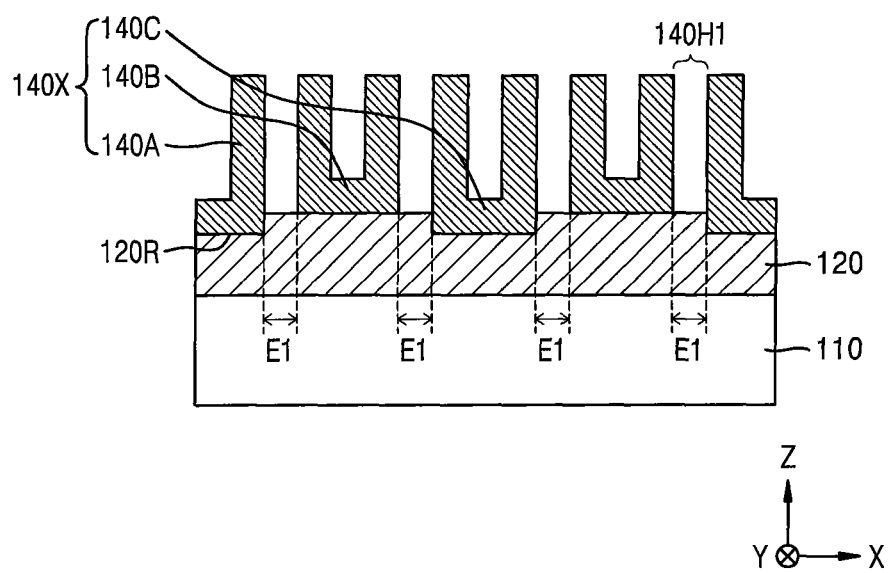

Referring to FIG. 3F, in a similar manner to that described with reference to FIG. 2K, the plurality of sacrificial spacers 132S are removed through the plurality of first openings 140H1 while each of a plurality of second portions 140B and a plurality of third portions 140C included in the spacer layer 140X is covered with the protective pattern 144 (see FIG. 3E), thereby exposing the plurality of first etch regions E1 of the feature layer 120 by the plurality of first openings 140H1.

The plurality of protective patterns 144 (see FIG. 3E) are removed, thereby exposing the plurality of second portions 140B and the plurality of third portions 140C included in the spacer layer 140X.

Figure 3G:
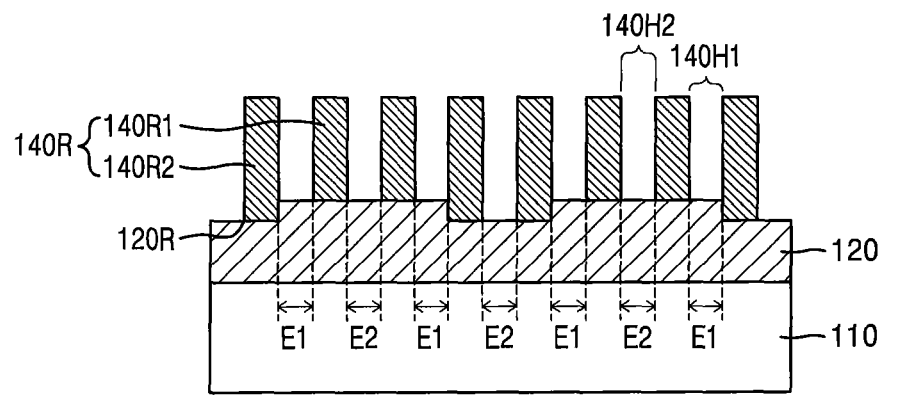

Referring to FIG. 3G, the plurality of second portions 140B and the plurality of third portions 140C included in the spacer layer 140X are removed, thereby forming the plurality of second openings 140H2, which expose the plurality of second etch regions E2 of the feature layer 120, and simultaneously forming a plurality of spacers 140R, which include the plurality of first portions 140A included in the spacer layer 140X, the plurality of second etch regions E2 being apart from the plurality of first etch regions E1.

The plurality of spacers 140R may include a plurality of first spacers 140R1 and a plurality of second spacers 140R2. In some embodiments, the plurality of first spacers 140R1 may have vertical lengths (e.g., thicknesses in the Z direction) different from vertical lengths (e.g., thicknesses in the Z direction) of the plurality of second spacers 1402. The vertical lengths of the plurality of second spacers 140R2 may be greater (e.g., longer) than the vertical lengths of the plurality of first spacers 140R1. A bottom surface of each of the plurality of second spacers 140R2 may be closer to the substrate 110 than a bottom surface of each of the plurality of first spacers 140R1. The plurality of first spacers 140R1 and the plurality of second spacers 140R2 are alternately arranged two by two in the X direction. In some embodiments, two of the plurality of first spacers 140R1 and two of the plurality of second spacers 140R2 may be arranged in an alternating sequence in the X direction, as illustrated in FIG. 3H.

While the spacer layer 140X is etched to remove the plurality of second portions 140B and the plurality of third portions 140C included in the spacer layer 140X, upper portions of the plurality of first portions 140A included in the spacer layer 140X may also be etched, and thus, a height of each of the plurality of spacers 140R obtained from the plurality of first portions 140A may be reduced.

Figure 3H:
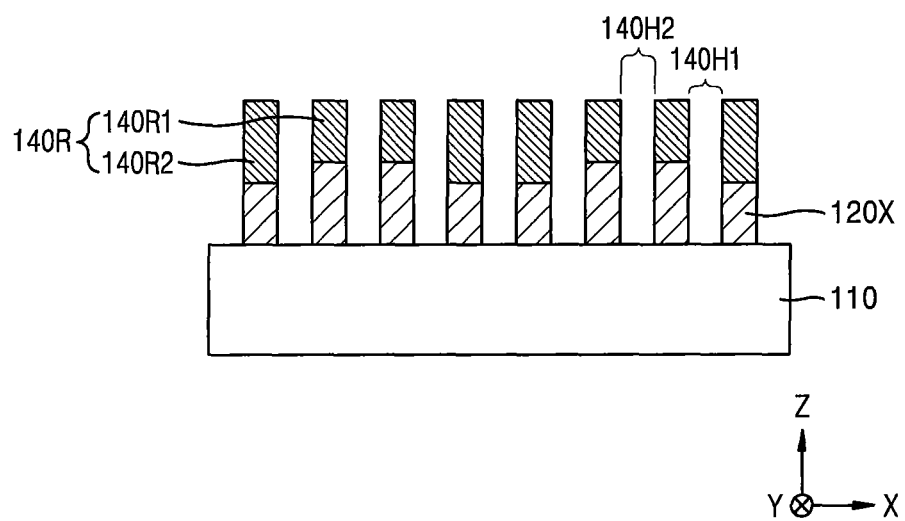

Referring to FIG. 3H, the plurality of first etch regions E1 and the plurality of second etch regions E2 of the feature layer 120 are etched by using the plurality of spacers 140R as an etch mask, thereby forming a plurality of feature patterns 120X.

In some embodiments, a top surface of each of the plurality of feature patterns 120X may be exposed by removing the plurality of spacers 140R.

In some embodiments, a series of processes described with reference to FIGS. 3D to 3H may be performed in situ in one chamber without breaking a vacuum (e.g., in a single chamber).

According to the methods of fabricating the integrated circuit device according to the inventive concept, which have been described with reference to FIGS. 3A to 3H, to form the plurality of feature patterns 120X on the substrate 110, a QPT process including one photolithography process and two double patterning processes is used, and here, the plurality of sacrificial spacers 132S obtained by first double patterning, and the plurality of spacers 140R obtained by second double patterning are formed at an equal level on the feature layer 120. Therefore, as appreciated by the present inventors, intermediate sacrificial films used in conventional processes may not be needed. Accordingly, processes of forming the plurality of spacers 140R may be simplified, and manufacturing costs associated with the processes may be reduced.

In some embodiments, the plurality of spacers 140R that are used to as an etch mask while etching the feature layer 120 may be formed by a QPT process that includes one photolithography process and two double patterning processes without using an intermediate sacrificial film. In some embodiments, the plurality of spacers 140R may have upper surfaces that are coplanar with each other, as illustrated in FIG. 3H.

Figure 4:
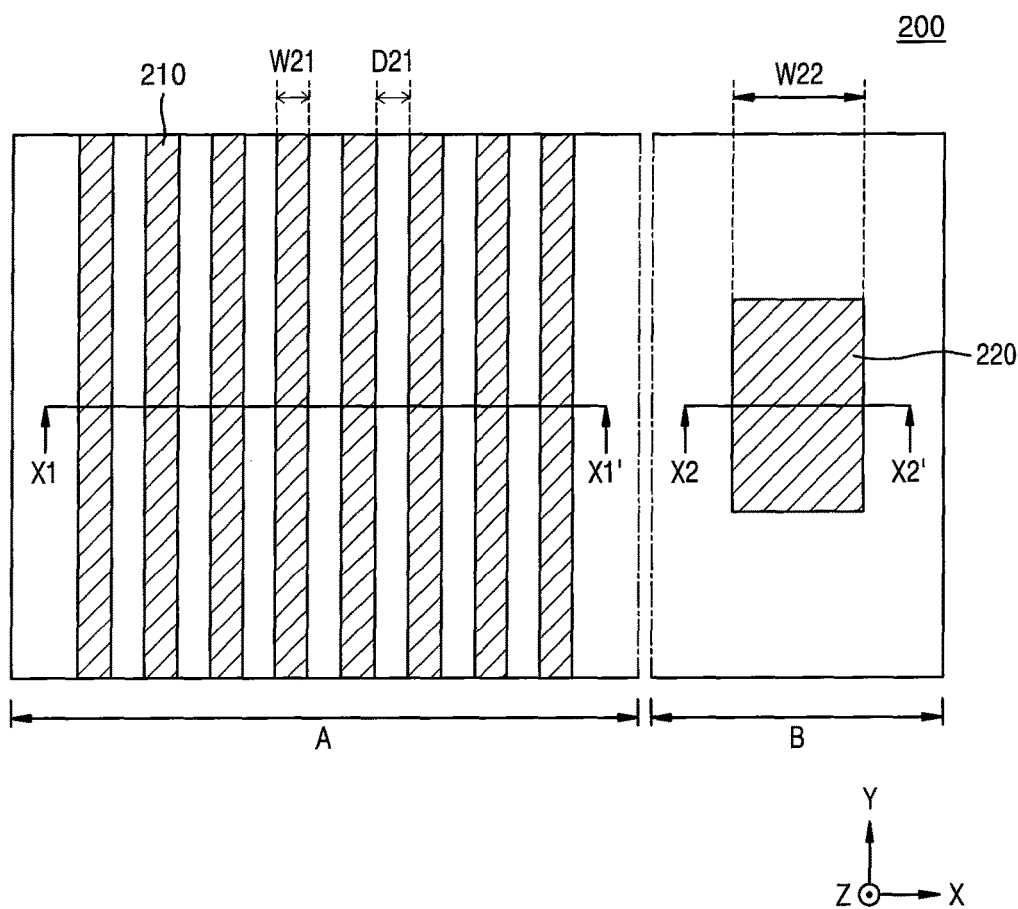
FIG. 4 is a layout of an integrated circuit device according to example embodiments of the present inventive concept.

FIG. 4 is a layout of an integrated circuit device 200 according to some embodiments of the inventive concept.

Referring to FIG. 4, the integrated circuit device 200 may include a first region A and a second region B.

The first region A may be a high-density region in which a plurality of first patterns having relatively fine sizes are formed at a relatively high density. The second region B may be a low-density region in which a plurality of second patterns having larger sizes than those in the first region A are formed at a relatively low density. In some embodiments, the first region A may be a cell array region in which unit memory devices are formed. For example, a memory cell array constituting the integrated circuit device 200 may be formed in the first region A. In some embodiments, the second region B may be a peripheral circuit region or core region in which peripheral circuits for driving the unit memory devices formed in first region A are formed. Alternatively, the second region B may be a portion of the cell array region, in which patterns having relatively large widths are formed.

The first region A may include a plurality of first patterns 210 extending parallel to each other, and each of the plurality of first patterns 210 may have a first width W21 in the X direction of a relatively small dimension. The plurality of first patterns 210 may be spaced apart from each other in the X direction, with a first gap D21 of a relatively small dimension therebetween. In the first region A, the first width W21 and the first gap D21 may be arbitrarily designed, depending upon kinds of unit devices desired to be formed and desired properties thereof. For example, the first width W21 may be equal to the first gap D21. In some embodiments, the first width W21 may be greater (e.g., wider) than or less (e.g., narrower) than the first gap D21. The second region B may include a second pattern 220 having a second width W22 in the X direction of a relatively large dimension.

In some embodiments, the plurality of first patterns 210 may include a plurality of active regions formed in the cell array region, and the second pattern 220 may include an active region of the peripheral circuit region. In some embodiments, the plurality of first patterns 210 may include a plurality of fine conductive patterns formed in the cell array region, and the second pattern 220 may include a conductive pattern having a relatively large width. In some embodiments, the conductive pattern may be formed in the peripheral circuit region or the cell array region. In some embodiments, the second pattern 220 may include an alignment key.

Figure 5A:
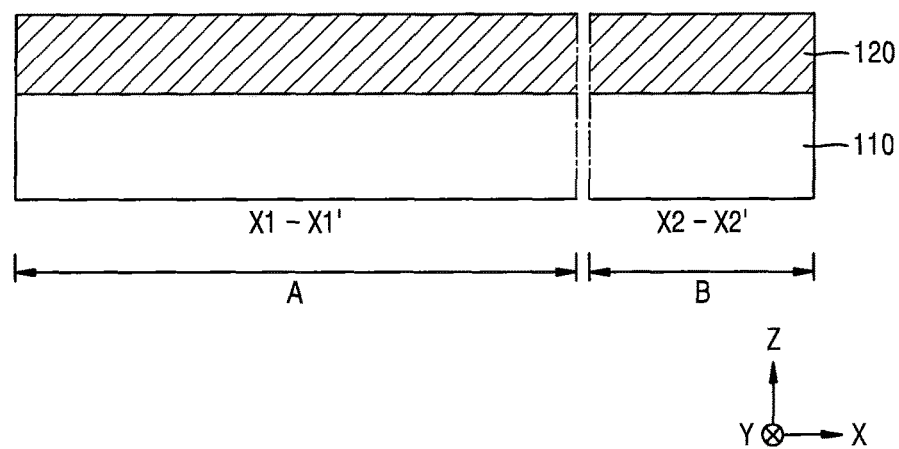
FIGS. 5A through 5O are cross-sectional views illustrating methods of fabricating an integrated circuit device, according to example embodiments of the inventive concept.
Figure 5B:
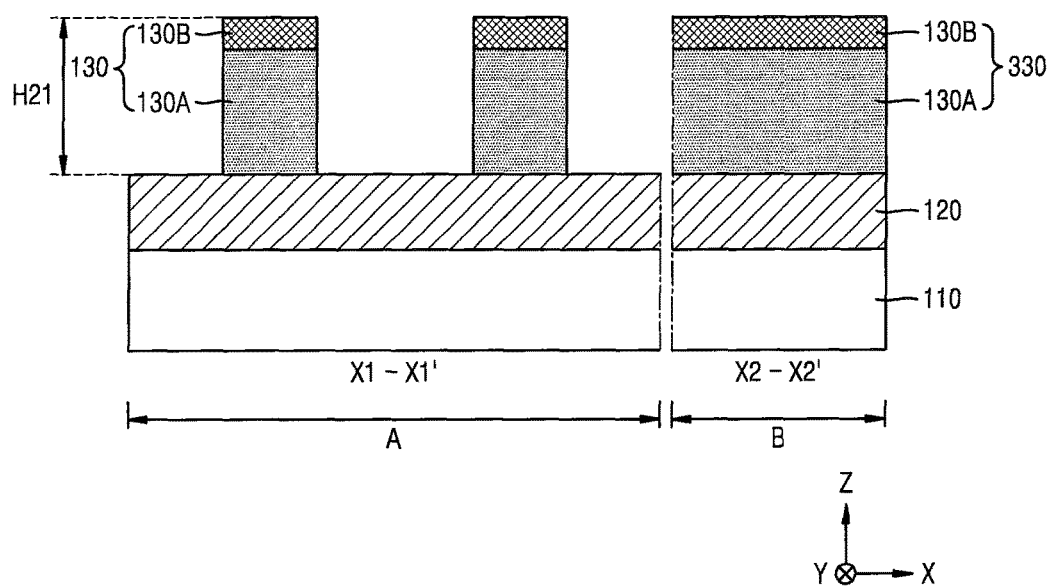
Figure 5C:
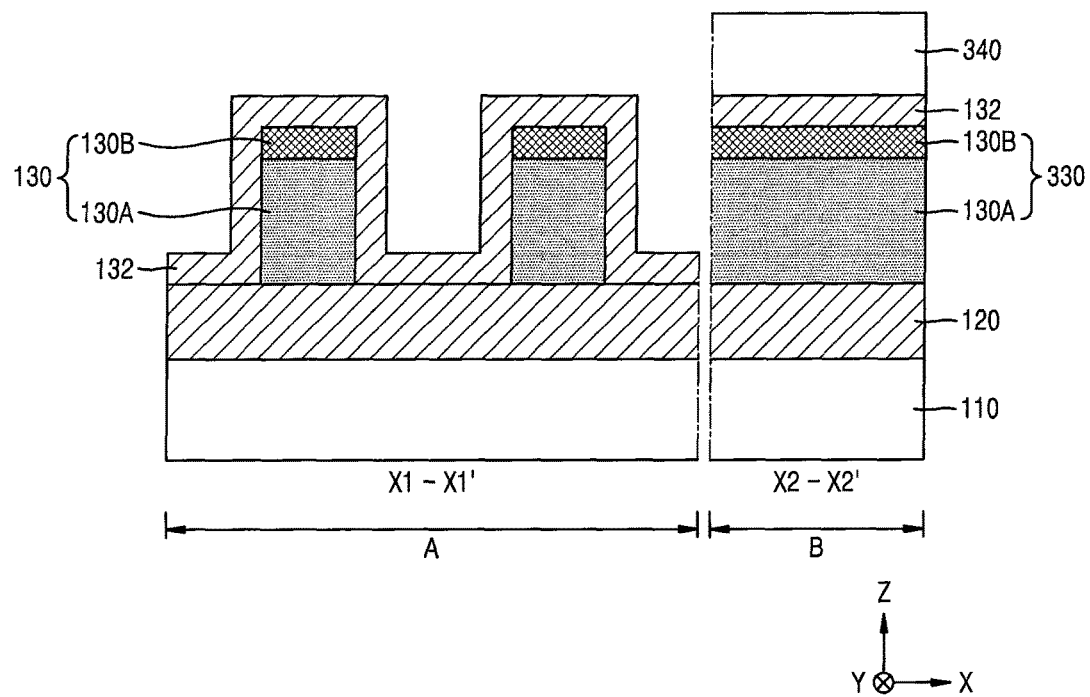
Figure 5D:
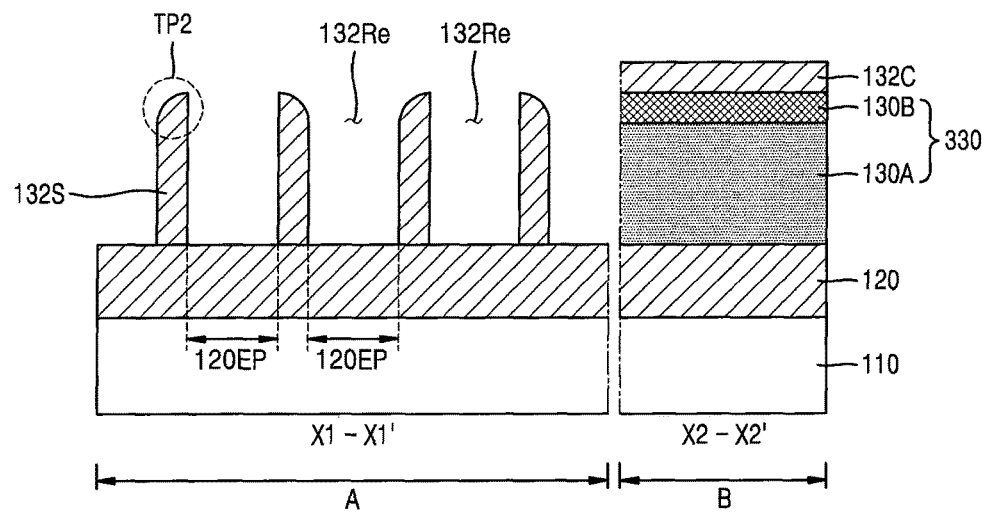
Figure 5E:
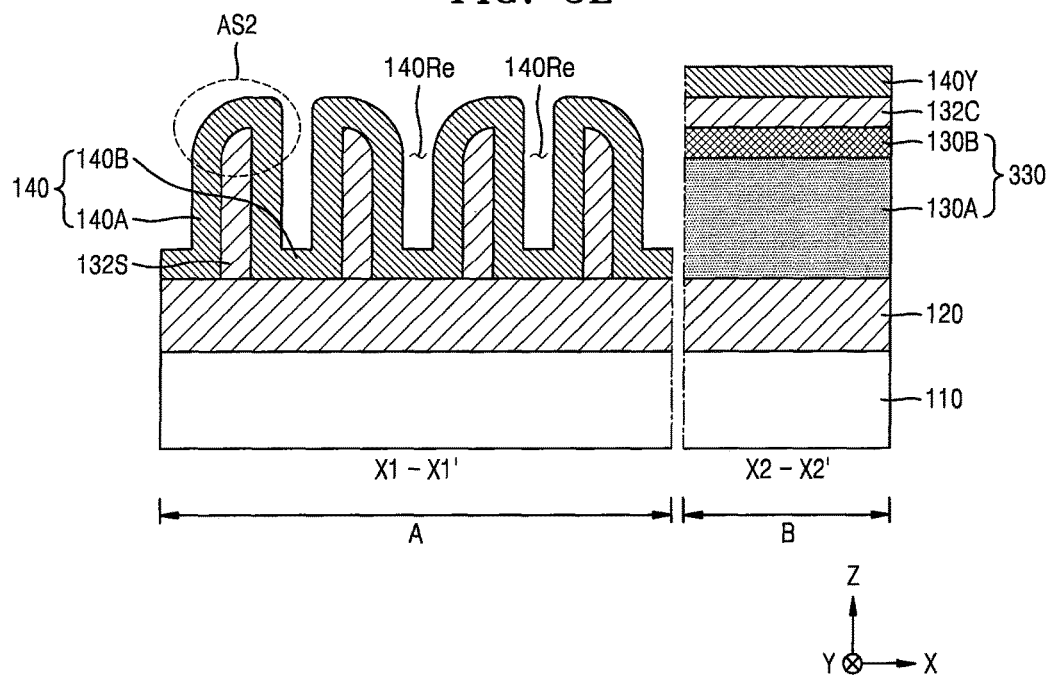
Figure 5F:
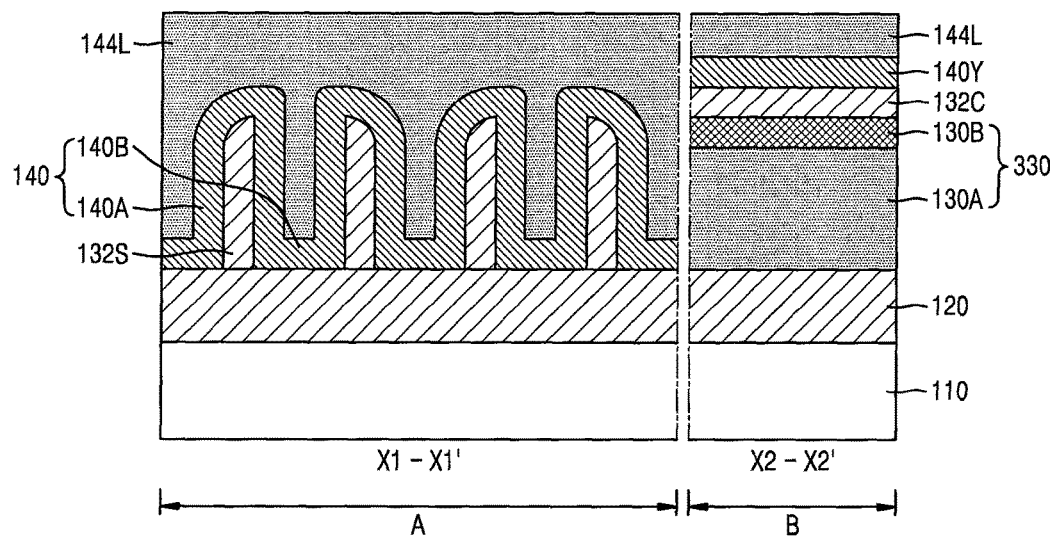
Figure 5G:
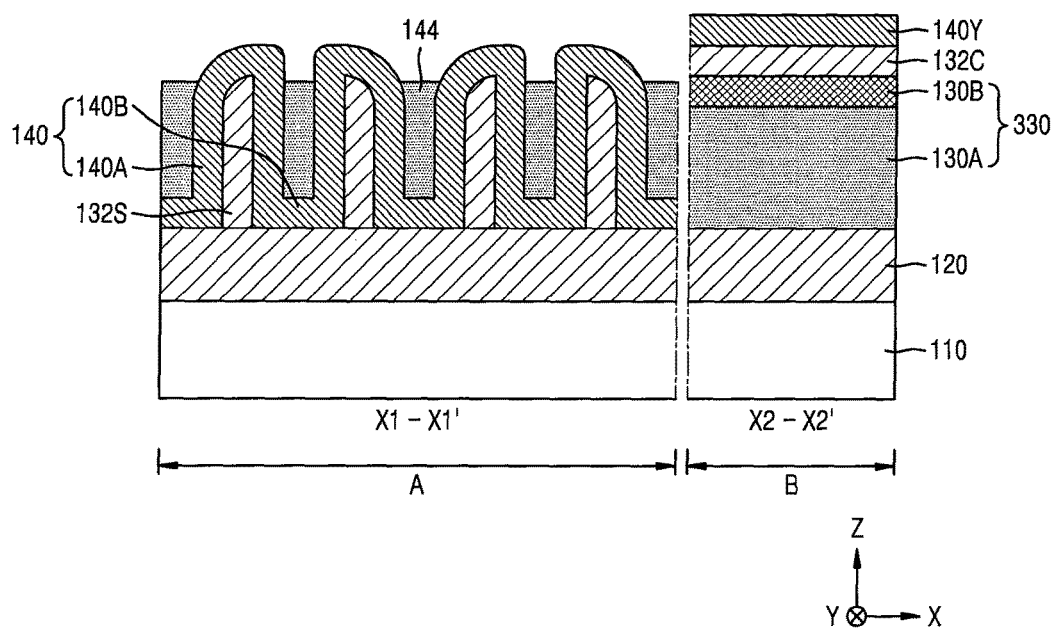
Figure 5H:
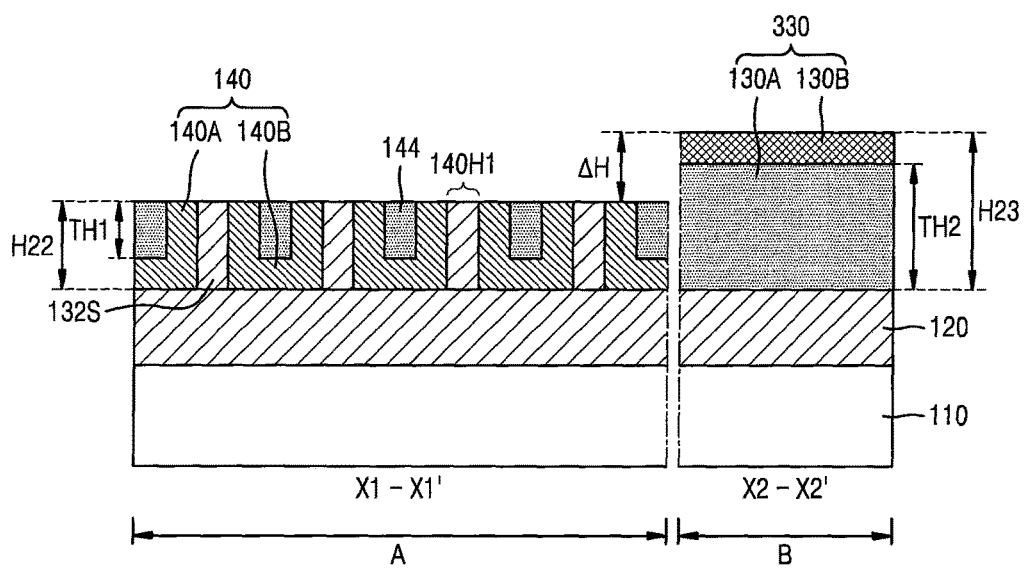
Figure 5I:
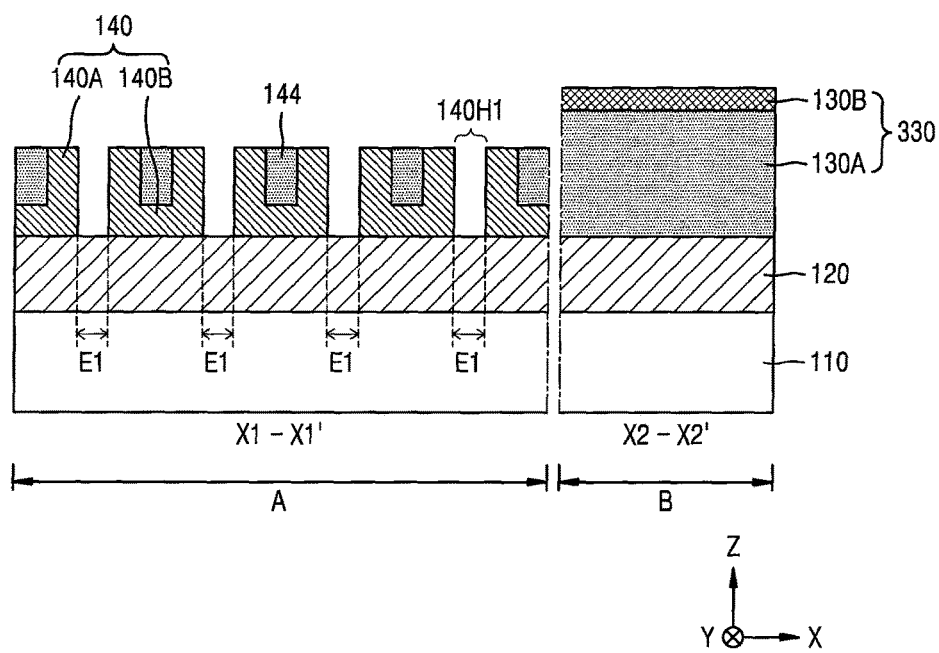
Figure 5J:
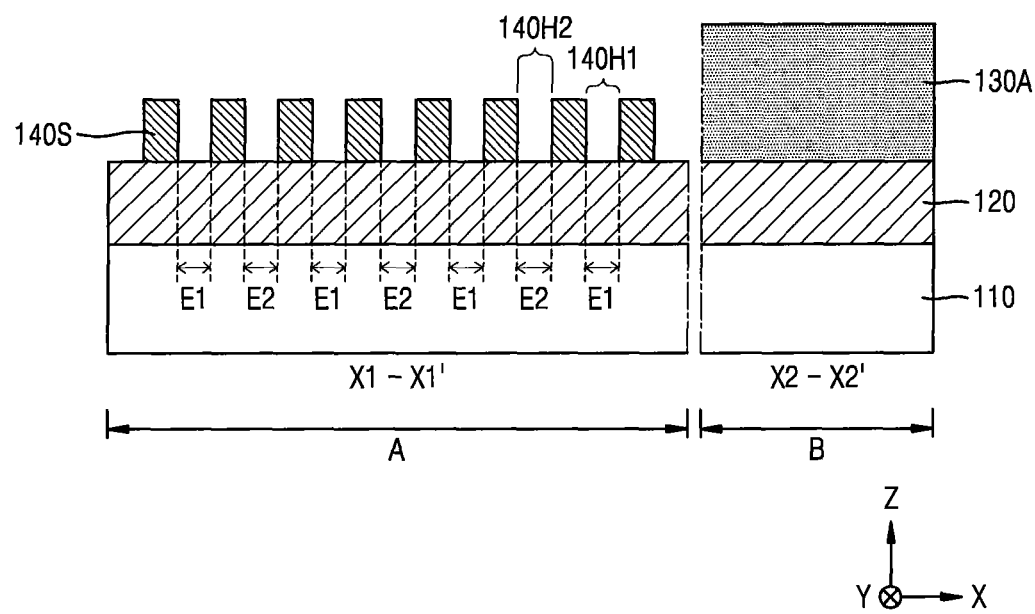
Figure 5K:
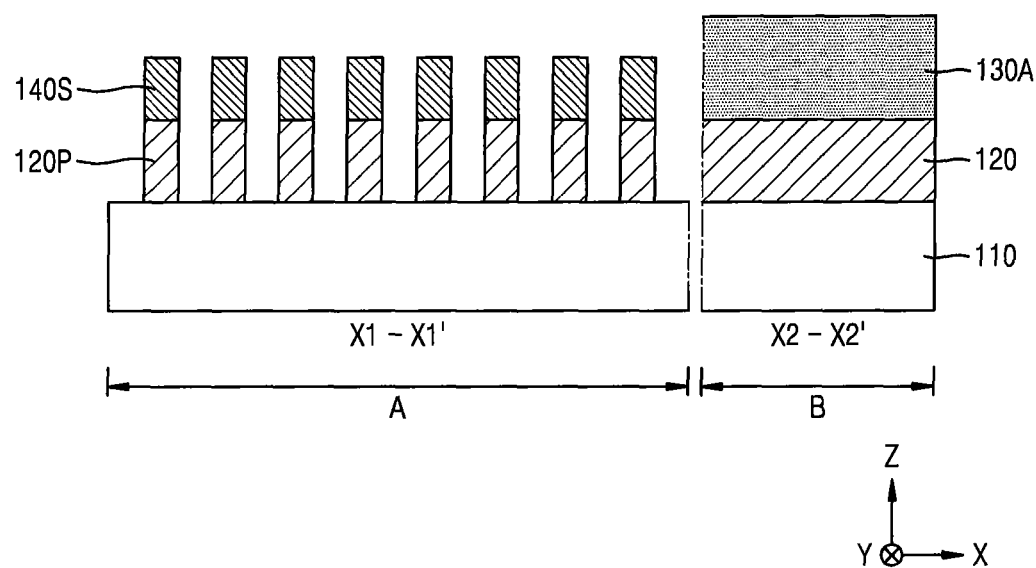
Figure 5L:
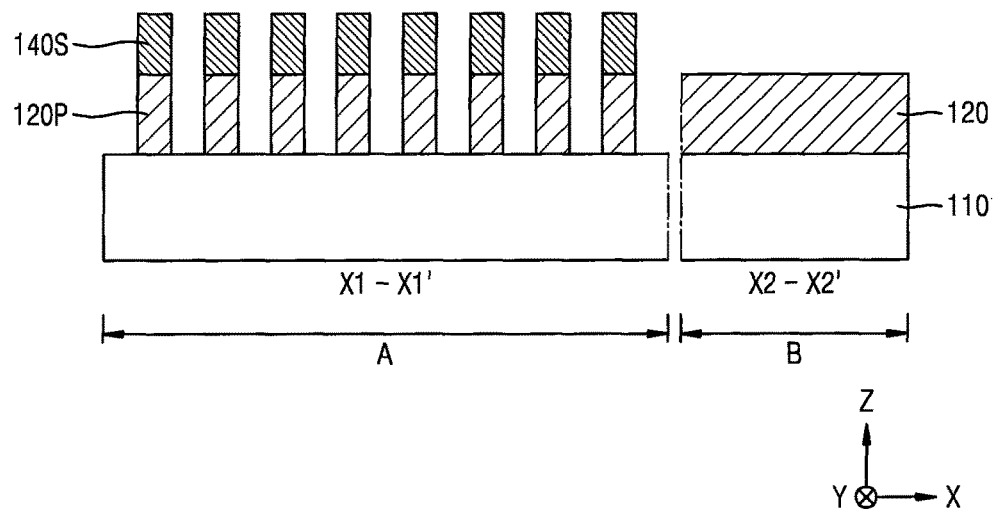
Figure 5M:
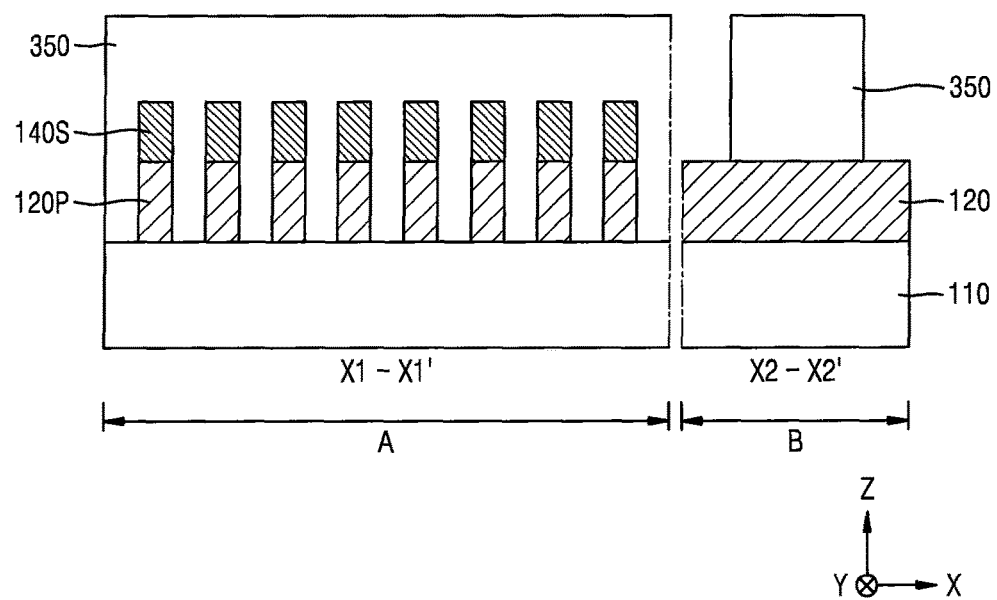
Figure 5N:
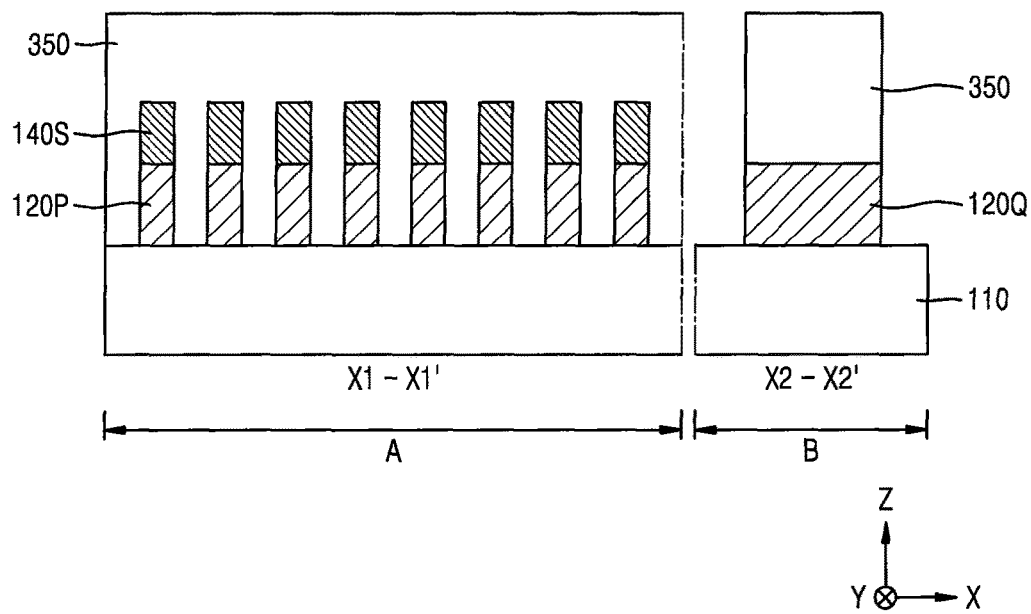
Figure 5O:
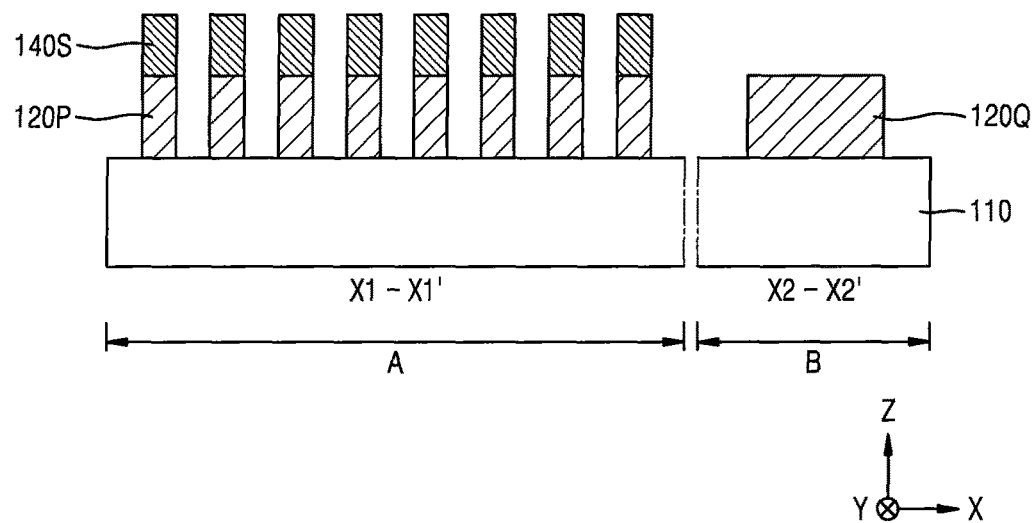

FIGS. 5A through 5O are cross-sectional views illustrating operations/processes of methods of fabricating an integrated circuit device according to some embodiments of the present inventive concept. In some embodiments, the operations/processes described in FIGS. FIGS. 5A through 5O may occur sequentially.

The integrated circuit device 200 shown in FIG. 4 may be fabricated by using the methods of fabricating the integrated circuit device, which are described below with reference to FIGS. 5A through 5O. In each of FIGS. 5A to 5O, a portion corresponding to a cross-section taken along a line X1-X1' of FIG. 4 is illustrated in the first region A, and a portion corresponding to a cross-section taken along a line X2-X2' of FIG. 4 is illustrated in the second region B. In FIGS. 5A to 5O, the same reference numerals as those in FIGS. 2A to 2N respectively denote the same or similar members (e.g., elements), and descriptions thereof may be omitted.

Referring to FIG. 5A, the feature layer 120 is formed in the first region A and the second region B, on the substrate 110.

Referring to FIG. 5B, the plurality of reference patterns 130 are formed on (e.g., formed to cover) the feature layer 120 in the first region A, and a blocking film 330 is formed on (e.g., formed to cover) to cover the feature layer 120 in the second region B.

The plurality of reference patterns 130 and the blocking film 330 may each include the same material. The plurality of reference patterns 130 and the blocking film 330 may be simultaneously formed. In some embodiments, the plurality of reference patterns 130 and the blocking film 330 may each include a stack structure including the carbon-containing film 130A and the etch stop film 130B.

In some embodiments, to form the plurality of reference patterns 130 and the blocking film 330, first, a carbon-containing film and an SiON film may be formed, in this stated order, on the feature layer 120 in the first region A and the second region B, followed by patterning the carbon-containing film and the SiON film by a photolithography process. The plurality of reference patterns 130 and the blocking film 330 may each have a first height H21 in a vertical direction from the top surface of the feature layer 120. It will be understand that a first height H21 of the plurality of reference patterns 130 and the blocking film 330 may be referred to as a thickness thereof in the vertical direction (e.g., the Z direction) that is perpendicular to an upper surface of the substrate 110.

Referring to FIG. 5C, the sacrificial spacer layer 132 is formed to cover the plurality of reference patterns 130 and the blocking film 330, in the first region A and the second region B.

The sacrificial spacer layer 132 may conformally extend on (e.g., conformally cover) a top surface and both sidewalls of each of the plurality of reference patterns 130 and the top surface of the feature layer 120 in the first region A, and may conformally extend on (e.g., conformally cover) a top surface and sidewalls of the blocking film 330 in the second region B. In some embodiments, the sacrificial spacer layer 132 may have a uniform thickness along a top surface and both sidewalls of each of the plurality of reference patterns 130 and the top surface of the feature layer 120 in the first region A, as illustrated in FIG. 5C.

The sacrificial spacer layer 132 may include a material that is substantially identical to a material constituting the feature layer 120. For example, each of the sacrificial spacer layer 132 and the feature layer 120 may include a silicon oxide film. In some embodiments, the sacrificial spacer layer 132 may include a material that is the same as that of the feature layer 120.

A mask pattern 340 may be formed on the sacrificial spacer layer 132, and the mask pattern 340 may extend on (e.g., cover) only the second region B. In some embodiments, the mask pattern 340 may not be formed on the first region A and thus may expose the first region A. The mask pattern 340 may include, for example, a photoresist pattern, but the present inventive concept is not limited thereto. The mask pattern 340 may include different materials.

Referring to FIG. 5D, while the sacrificial spacer layer 132 in the second region B is maintained covered with the mask pattern 340, the sacrificial spacer layer 132 in the first region A is removed (e.g., etched back), by using the mask pattern 340 as an etch mask, in the same manner as described with reference to FIG. 2D, thereby leaving the plurality of sacrificial spacers 132S, which are portions of the sacrificial spacer layer 132 covering both sidewalls of each of the plurality of reference patterns 130. An upper end TP2 of each of the plurality of sacrificial spacers 132S formed on the feature layer 120 in the first region A may have opposing sidewalls asymmetrical with respect to each other in the X direction. A portion of the sacrificial spacer layer 132, which is covered with the mask pattern 340 in the second region B, may remain as a first covering layer 132C.

The plurality of reference patterns 130 in the first region A are removed in the same manner as described with reference to FIGS. 2E and 2F. In the first region A, the top surface of the feature layer 120 may be exposed by spaces between the plurality of sacrificial spacers 132S. In the second region B, the first covering layer 132C may be exposed by removing the mask pattern 340. In some embodiments, the plurality of sacrificial spacers 132S may define a plurality of sacrificial spacer recesses 132Re, and the plurality of sacrificial spacer recesses 132Re may expose portions 120EP of the feature layer 120, respectively, as illustrated in FIG. 5D.

Referring to FIG. 5E, the spacer layer 140 extending along (e.g., covering) the plurality of sacrificial spacers 132S in the first region A, and a second covering layer 140Y extending along (e.g., covering) the first covering layer 132C in the second region. B may be simultaneously formed.

The spacer layer 140 and the second covering layer 140Y may include the same material and may be simultaneously formed by the same deposition process. In some embodiments, both the spacer layer 140 and the second covering layer 140Y may be formed by a single deposition process. Each of the spacer layer 140 and the second covering layer 140Y may include a material different from a material constituting each of the feature layer 120, the plurality of sacrificial spacers 132S, and the first covering layer 132C. For example, when each of the feature layer 120, the plurality of sacrificial spacers 132S, and the first covering layer 132C includes a silicon oxide film, each of the spacer layer 140 and the second covering layer 140Y may include polysilicon. To form the spacer layer 140 and the second covering layer 140Y, an Atomic Layer Deposition (ALD) process may be used.

The spacer layer 140 may include the plurality of first portions 140A extending on (e.g., contacting) both sidewalls of each of the plurality of sacrificial spacers 132S, and the plurality of second portions 140B extending on (e.g., contacting) the top surface of the feature layer 120 between the plurality of sacrificial spacers 132S. An upper portion AS2 of the spacer layer 140 may have asymmetrical outer sidewalls at both sides thereof, the upper portion AS2 covering the upper end TP2 of each sacrificial spacer 132S.

In some embodiments, the plurality of second portions 140B may overlap each of portions of the top surface of the feature layer 120 exposed to the plurality of sacrificial spacer recesses 132Re.

The second covering layer 140Y may extend on (e.g., cover) at least a portion of each of the blocking film 330 and the first covering layer 132C in the second region B. For example, the second covering layer 140Y may extend on (e.g., cover) a top surface and sidewalls of each of the blocking film 330 and the first covering layer 132C in the second region B.

Referring to FIG. 5F, the protective film 144L is formed on (e.g., formed to cover) the spacer layer 140 and the second covering layer 140Y, in the first region A and the second region B.

In some embodiments, the protective film 144L may include the same material as the carbon-containing film 130A constituting the blocking film 330. For example, each of the protective film 144L and the carbon-containing film 130A may include an SOH material.

Referring to FIG. 5G, the protective film 144L (see FIG. 5F) in the first region A and the second region B is etched back, thereby leaving the plurality of protective patterns 144 in the first region A and exposing the second covering layer 140Y in the second region B, the plurality of protective patterns 144 including portions of the protective film 144L, which cover the plurality of second portions 140B of the spacer layer 140 in the spaces between the plurality of sacrificial spacers 132S. In some embodiments, an upper portion of the protective film 144L may be removed to separate the plurality of protective patterns 144 from each other, and thus the plurality of protective patterns 144 may be spaced apart from each other as illustrated in FIG. 5G.

Referring to FIG. 5H, in a similar manner to that described with reference to FIG. 2J, the respective heights of the protective pattern 144, the spacer layer 140, and the plurality of sacrificial spacers 132S in the first region A are reduced by, for example, a dry etching process. As a result, the plurality of sacrificial spacers 132S may be exposed. In some embodiments, upper portions of the protective pattern 144, the spacer layer 140, and the plurality of sacrificial spacers 132S in the first region A may be removed by, for example, a dry etching process to expose the plurality of sacrificial spacers 132S.

The respective heights of the protective pattern 144, the spacer layer 140, and the plurality of sacrificial spacers 132S are reduced, since the upper end TP2 (see FIG. 5D) of each of the plurality of sacrificial spacers 132S and the upper portion AS2 (see FIG. 5E) of the spacer layer 140 are removed. The upper end TP2 and the upper portion AS2 each having an asymmetrical shape, which are portions causing a CD deviation in a subsequent process, may be removed and thus may not remain on the substrate 110. In addition, after the respective heights of the protective pattern 144, the spacer layer 140, and the plurality of sacrificial spacers 132S are reduced, the plurality of first openings 140H1 may be formed in the spacer layer 140, and the plurality of first openings 140H1 expose the plurality of sacrificial spacers 132S. In some embodiments, the plurality of first openings 140H1 may be defined by two adjacent ones of the plurality of first portions 140A of the spacer layer 140, as illustrated in FIG. 5H.

While performing a dry etching process for, in the first region A, reducing the respective heights of the protective pattern 144, the spacer layer 140, and the plurality of sacrificial spacers 132S and forming the plurality of first openings 140H1 in the spacer layer 140 is performed, since, in the second region B, the second covering layer 140Y and the first covering layer 132C, which are also exposed to an atmosphere of the dry etching process, may be consumed, the etch stop film 130B constituting the blocking film 330 in the second region B may be exposed.

A height H22 of the spacer layer 140 may be less than a height H23 of the blocking film 330 in the second region B. It will be understood that each of the height H22 of the spacer layer 140 and the height H23 of the blocking film 330 is the same as a thickness thereof in the vertical direction (e.g., Z direction), as illustrated in FIG. 5H. The protective pattern 144 in the first region A, and the carbon-containing film 130A in the second region B may include the same material, for example, an SOH material, and a thickness TH1 of the protective pattern 144 remaining in the first region A may be less (e.g., thinner) than a thickness TH2 of the carbon-containing film 130A in the second region B.

In some embodiments, the height H22 of each of the protective pattern 144, the spacer layer 140, and the plurality of sacrificial spacers 132S may be less than the height H23 of the blocking film 330, and less than the thickness TH2 of the carbon-containing film 130A. Thus, a level of a top surface of each of the protective pattern 144, the spacer layer 140, and the plurality of sacrificial spacers 132S may be lower than a level of a top surface of the blocking film 330. In particular, a difference (ΔH) between the level of the top surface of the spacer layer 140 in the first region A and the level of the top surface of the blocking film 330 may be at least about 100 Å, for example, about 100 Å to about 300 Å.

Referring to FIG. 5I, in a similar manner to that described with reference to FIG. 2K, the plurality of sacrificial spacers 132S are removed through the plurality of first openings 140H1, thereby exposing the plurality of first etch regions E1 of the feature layer 120.

During the removal of the plurality of sacrificial spacers 132S in the first region A, the etch stop film 130B exposed in the second region B may be partially consumed, and thus, the total thickness of the blocking film 330 may be reduced.

Referring to FIG. 5J, in a similar manner to that described with reference to FIG. 2L, the plurality of protective patterns 144 in the first region A are removed from a result product of FIG. 5I, thereby exposing the plurality of second portions 140B of the spacer layer 140. Next, in the same manner as described with reference to FIG. 2M, the plurality of second portions 140B of the spacer layer 140 in the first region A are removed, thereby forming the plurality of second openings 140H2, which expose the plurality of second etch regions E2 of the feature layer 120, and simultaneously forming the plurality of spacers 140S, which include portions of the plurality of first portions 140A included in the spacer layer 140.

During the formation of the plurality of spacers 140S in the first region A, the etch stop film 130B of the blocking film 330 exposed in the second region B may be consumed (e.g., etched), and thus the total thickness of the blocking film 330 may be reduced. In some embodiments, during the formation of the plurality of spacers 140S, the etch stop film 130B of the blocking film 330 exposed in the second region B may be only partially consumed, or the etch stop film 130B may be completely consumed, and then, the carbon-containing film 130A thereunder may also be partially consumed, whereby the total thickness of the blocking film 330 may be reduced.

Referring to FIG. 5K, while the feature layer 120 in the second region B is covered with the carbon-containing film 130A, the plurality of first etch regions E1 and the plurality of second etch regions E2 of the feature layer 120 are etched by using the plurality of spacers 140S in the first region A as an etch mask, thereby forming the plurality of feature patterns 120P.

During the etching of plurality of first etch regions E1 and the plurality of second etch regions E2 of the feature layer 120, the carbon-containing film 130A may be partially removed, and thus, after the plurality of feature patterns 120P are formed in the first region A, the carbon-containing film 130A having a reduced thickness may remain on the feature layer 120 in the second region B.

In some embodiments, a series of processes described with reference to FIGS. 5G to 5K may be performed in situ in one chamber without breaking a vacuum. In some embodiments, processes described with reference to FIGS. 5G to 5K may be performed in a single chamber without breaking a vacuum.

Referring to FIG. 5L, the carbon-containing film 130A remaining on the feature layer 120 in the second region B is removed, thereby exposing the top surface of the feature layer 120 in the second region B.

Referring to FIG. 5M, a mask pattern 350 is formed on a result product of FIG. 5L. The mask pattern 350 may be formed to completely cover the first region A and to only partially cover the feature layer 120 in the second region B. The first region A may include the plurality of feature patterns 120P formed on the substrate 110. The mask pattern 350 may include, for example, a photoresist pattern, but the present inventive concept is not limited thereto. The mask pattern 350 may include various materials.

Referring to FIG. 5N, the feature layer 120 exposed in the second region B is etched by using the mask pattern 350 as an etch mask, thereby forming a wide pattern 120Q in the second region B.

The wide pattern 120Q may have a width greater than a width of each of the plurality of feature patterns 120P formed in the first region A.

Referring to FIG. 5O, the mask pattern 350 in the first region A and the second region B is removed, thereby exposing top surfaces of the plurality of spacers 140S in the first region A and exposing a top surface of the wide pattern 120Q in the second region B, the plurality of spacers 140S being on (e.g., covering) the plurality of feature patterns 120P.

In some embodiments, the plurality of feature patterns 120P and the wide pattern 120Q may respectively correspond to the plurality of first patterns 210 and the second pattern 220 of the integrated circuit device 200 shown in FIG. 4.

According to the method of fabricating the integrated circuit device, according to the inventive concept, the method having been described with reference to FIGS. 5A to 5O, to form the plurality of feature patterns 120P in the first region A on the substrate 110, a QPT process including one photolithography process and two double patterning processes is used, and here, the plurality of sacrificial spacers 132S obtained by first double patterning, and the plurality of spacers 140S obtained by second double patterning are formed at an equal level on the feature layer 120. Thus, unlike conventional processes, separate intermediate sacrificial films for pattern transfer may not be needed between the plurality of sacrificial spacers 132S and the plurality of spacers 140S. Therefore, processes of respectively forming the plurality of feature patterns 120P and the wide pattern 120Q in the first region A and the second region B on the substrate 110 may be simplified. The plurality of feature patterns 120P each may have a width different from that of the wide pattern 120Q, and manufacturing costs may be reduced.

In the method of fabricating the integrated circuit device, according to the inventive concept, which have been described with reference to FIGS. 5A to 5O, although a method of forming the plurality of feature patterns 120P in the first region A by using the processes described with reference to FIGS. 2A to 2N has been described, the method described with reference to FIGS. 3A to 3H may be used.

Figure 6A:
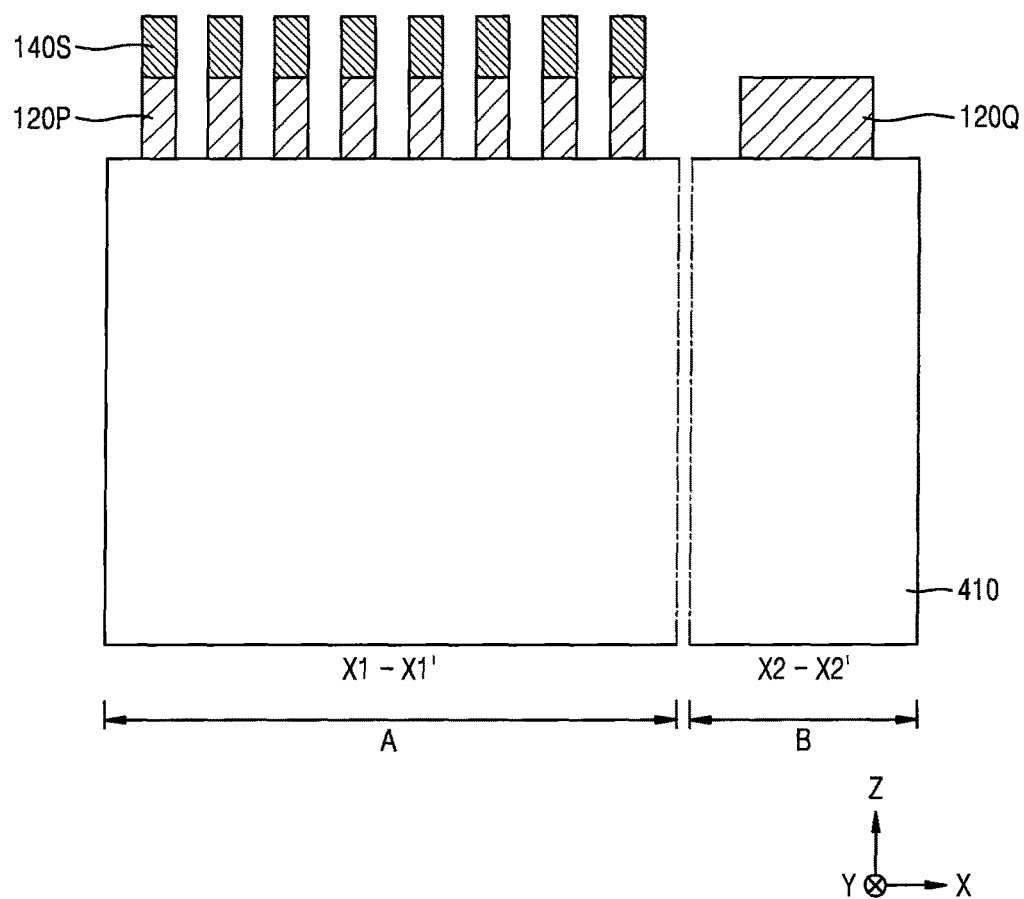
FIGS. 6A through 6C are cross-sectional views illustrating methods of fabricating an integrated circuit device, according to example embodiments of the present inventive concept.
Figure 6B:
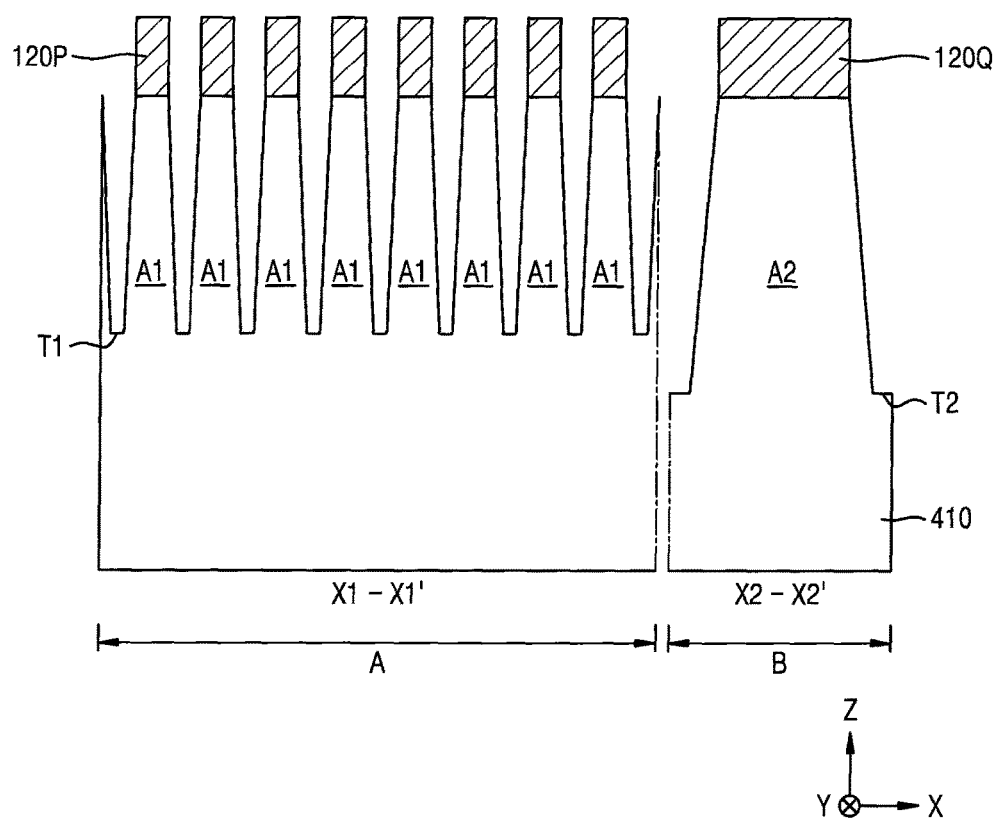
Figure 6C:
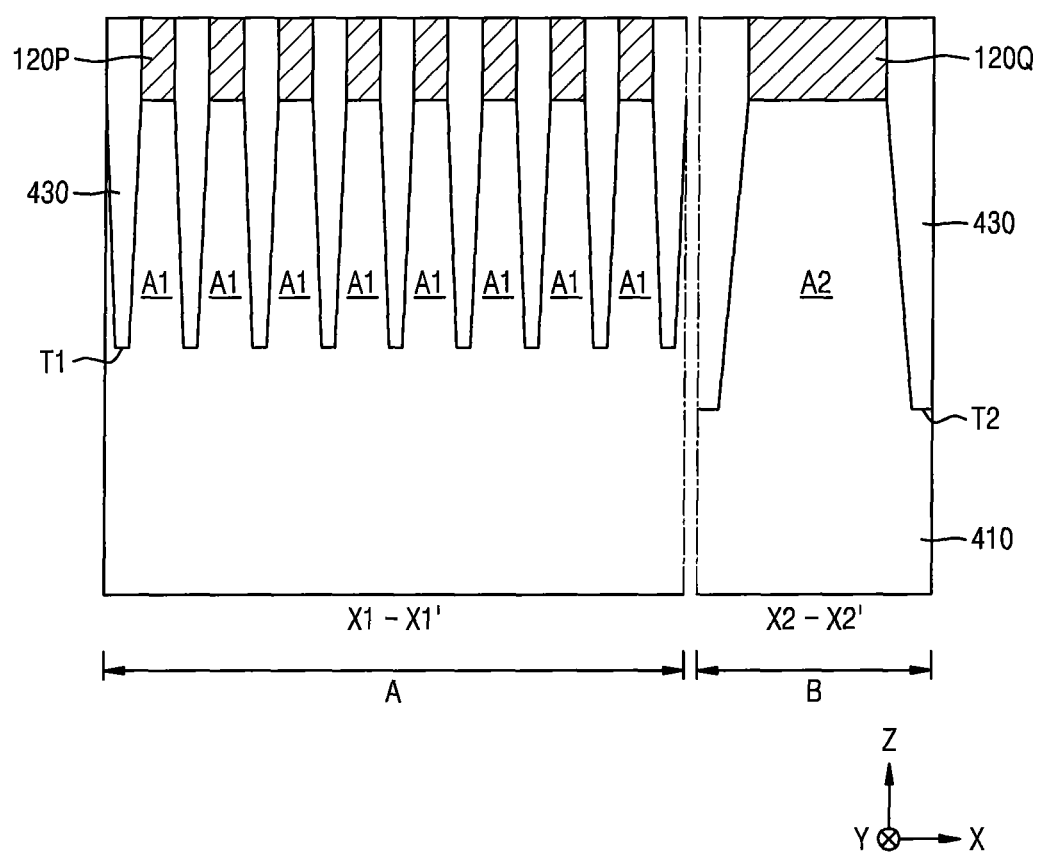

FIGS. 6A to 6C are cross-sectional views illustrating operations/processes of methods of fabricating an integrated circuit device according to some embodiments of the inventive concept. In FIGS. 6A to 6C, the same reference numerals as in FIGS. 5A to 5O respectively denote the same members, and descriptions thereof may be omitted. In some embodiments, the operations/processes described in FIGS. 6A to 6C may occur sequentially.

Referring to FIG. 6A, a substrate 410 is prepared. The substrate 410 may have substantially the same configuration as described regarding the substrate 110 with reference to FIG. 2A.

Next, the feature layer 120 shown in FIG. 5A is formed on the substrate 410 in the first region A and the second region B, and the processes described with reference to FIGS. 5B to 5O are performed, thereby forming the plurality of feature patterns 120P and the wide pattern 120Q on the substrate 410 in the first region A and the second region B, respectively. In the first region A, the plurality of feature patterns 120P may be covered with the plurality of spacers 140S.

Referring to FIG. 6B, in the first region A and the second region B, the substrate 410 is etched by using the plurality of feature patterns 120P and the wide pattern 120Q as an etch mask, thereby forming a plurality of trenches T1 and T2 in the substrate 410.

A width of each of a plurality of trenches T1 formed in the first region A may be less (e.g., narrower) than a width of each of a plurality of trenches T2 formed in the second region B. A plurality of active regions A1 and A2 may be defined in the substrate 410 by the plurality of trenches T1 and T2 formed in first region A and the second region B. In particular, a plurality of active regions A1, which are repeatedly formed at fine pitches beyond a resolution limit in a photolithography process and have fine widths, may be formed in the first region A, and an active region A2, which has a relatively large width implementable within the resolution limit in the photolithography process, may be defined in the second region B.

During the formation of the plurality of trenches T1 and T2 in the substrate 410 by etching the substrate 410, in the first region A, the plurality of spacers 140S being on (e.g., covering) the plurality of feature patterns 120P may be removed, and thus, top surfaces of the plurality of feature patterns 120P may be exposed.

Referring to FIG. 6C, an insulating material fills the plurality of trenches T1 and T2, followed by performing planarization thereof, thereby forming a plurality of device isolation films 430. Each of the plurality of device isolation films 430 may include, for example, an oxide film, a nitride film, or combinations thereof In some embodiments, the plurality of active regions A1 and the active region A2 may respectively correspond to the plurality of first patterns 210 and the second pattern 220 of the integrated circuit device 200 shown in FIG. 4.

According to methods of fabricating the integrated circuit device according to the inventive concept, which are described with reference to FIGS. 6A to 6C, to define, in the first region A, the plurality of active regions A1 repeatedly formed at fine pitches beyond a resolution limit in a photolithography process and having fine widths, a QPT process including one photolithography process and two double patterning processes is used. Since the plurality of sacrificial spacers obtained by first double patterning and the plurality of spacers obtained by second double patterning are formed, at an equal level, on the substrate, and intermediate sacrificial films used in conventional processes are not needed, processes may be simplified, and manufacturing costs associated with the processes may be reduced.

Although the method of fabricating the integrated circuit device has been described, as an example, with reference to FIGS. 6A to 6C, the method including the processes of defining the plurality of active regions A1 and A2 in the substrate 410, the inventive concept is not limited thereto, and various modifications and changes may be made without departing from the spirit and scope of the inventive concept.

Figure 7A:
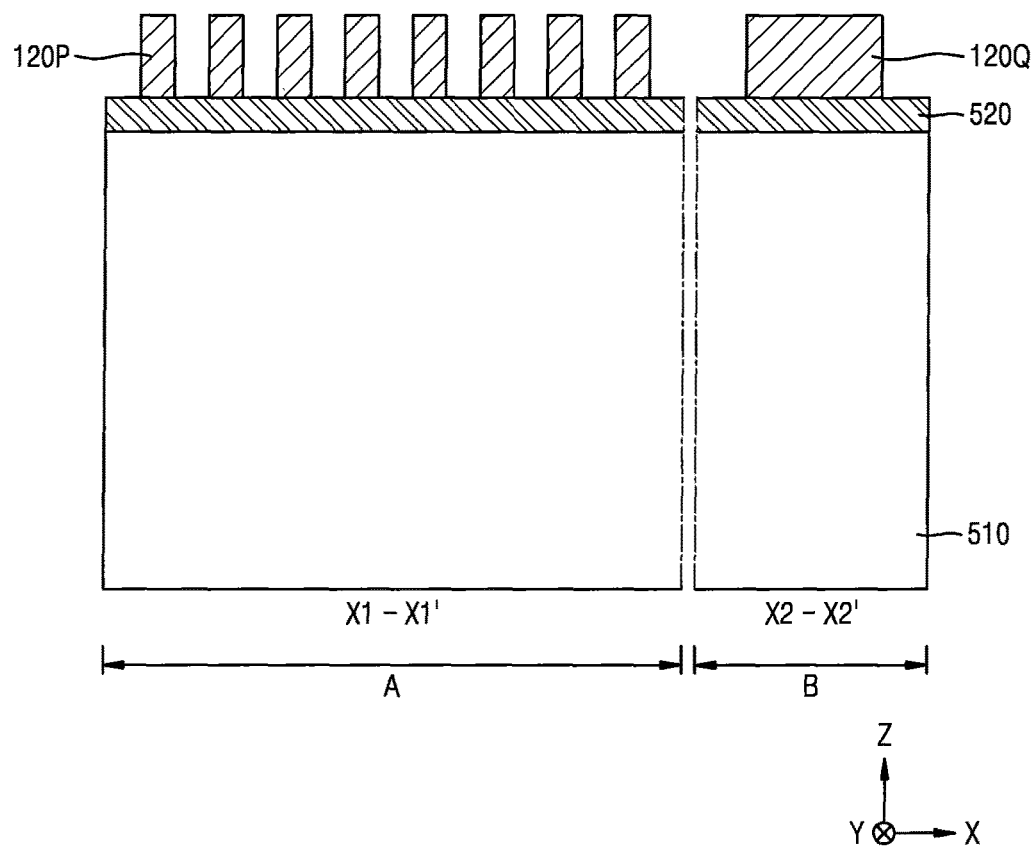
FIGS. 7A and 7B are cross-sectional views illustrating methods of fabricating an integrated circuit device, according to example embodiments of the present inventive concept.
Figure 7B:
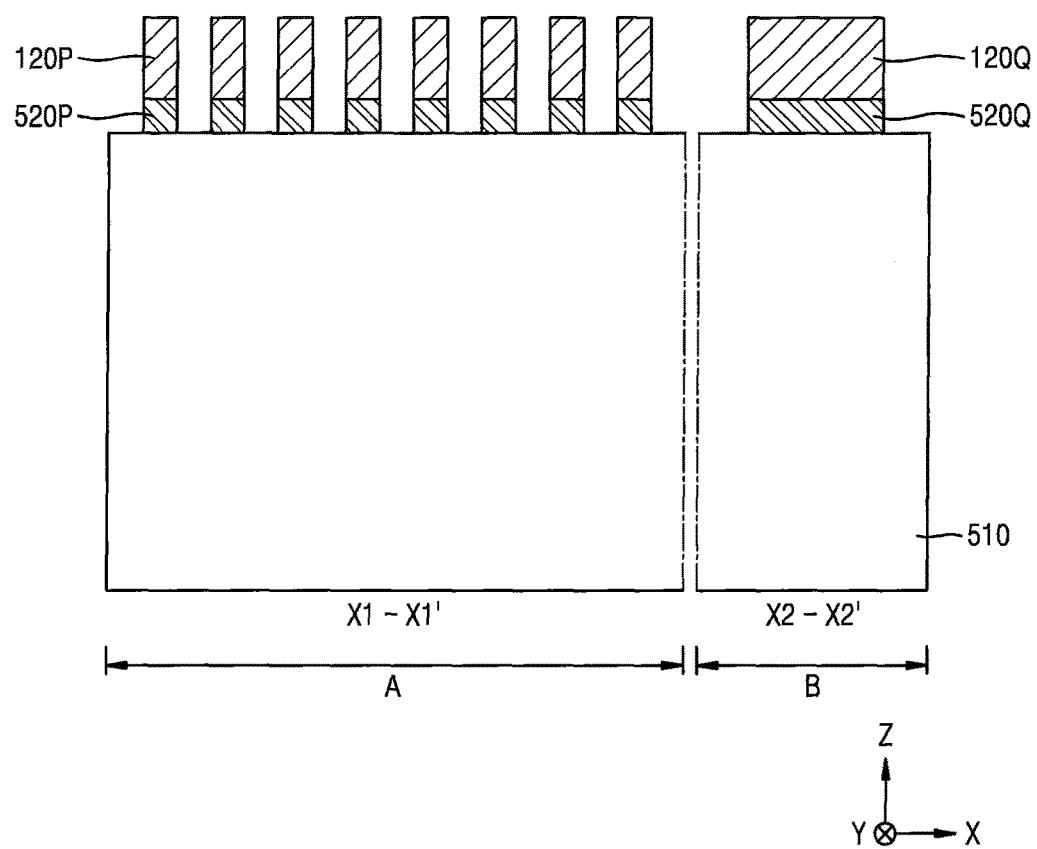

FIGS. 7A and 7B are cross-sectional views illustrating methods of fabricating an integrated circuit device according to some embodiments of the inventive concept. In FIGS. 7A and 7B, the same reference numerals as in FIGS. 5A to 5O respectively denote the same members, and descriptions thereof may be omitted.

Referring to FIG. 7A, a substrate 510 including the first region A and the second region B is prepared, and an etching target film 520 is formed on the substrate 510 in the first region A and the second region B.

The substrate 510 may have substantially the same configuration as described regarding the substrate 110 with reference to FIG. 2A. The etching target film 520 may be an insulating film or a conductive film. For example, the etching target film 520 may include a metal, an alloy, a metal carbide, a metal nitride, a metal oxynitride, a metal oxycarbide, a semiconductor, polysilicon, oxide, nitride, oxynitride, a hydrocarbon compound, or combinations thereof, but the present inventive concept is not limited thereto.

Next, the feature layer 120 shown in FIG. 5A is formed on the etching target film 520, and the processes described with reference to FIGS. 5B to 5O are performed, thereby forming the plurality of feature patterns 120P and the wide pattern 120Q over the substrate 510 in the first region A and the second region B, respectively. Next, residues of the plurality of spacers 140S (see FIG. 5O) remaining on the plurality of feature patterns 120P in the first region A may be removed, thereby exposing the top surface of each of the plurality of feature patterns 120P.

Referring to FIG. 7B, in the first region A and the second region B, the etching target film 520 is etched by using the plurality of feature patterns 120P and the wide pattern 120Q as an etch mask, thereby forming a plurality of fine patterns 520P and 520Q on the substrate 510.

A width of each of a plurality of fine patterns 520P formed in the first region A may be less (e.g., narrower) than a width of a fine pattern 520Q formed in the second region B. The plurality of fine patterns 520P formed in the first region A may be repeatedly formed at fine pitches beyond a resolution limit in a photolithography process and may have fine widths. The fine pattern 520Q formed in the second region B may have a relatively large width implementable within the resolution limit in the photolithography process.

According to the method of fabricating the integrated circuit device, according to the inventive concept, which are described with reference to FIGS. 7A and 7B, when the plurality of fine patterns 520P are formed in the first region A by using a QPT process, processes may be simplified, and costs associated with the processes may be reduced. Therefore, the integrated circuit device respectively including the plurality of fine patterns 520P and the fine pattern 520Q in the first region A and the second region B may be effectively implemented by the simplified processes, when the plurality of fine patterns 520P each have a different width from the fine pattern 520Q.

Figure 8A:
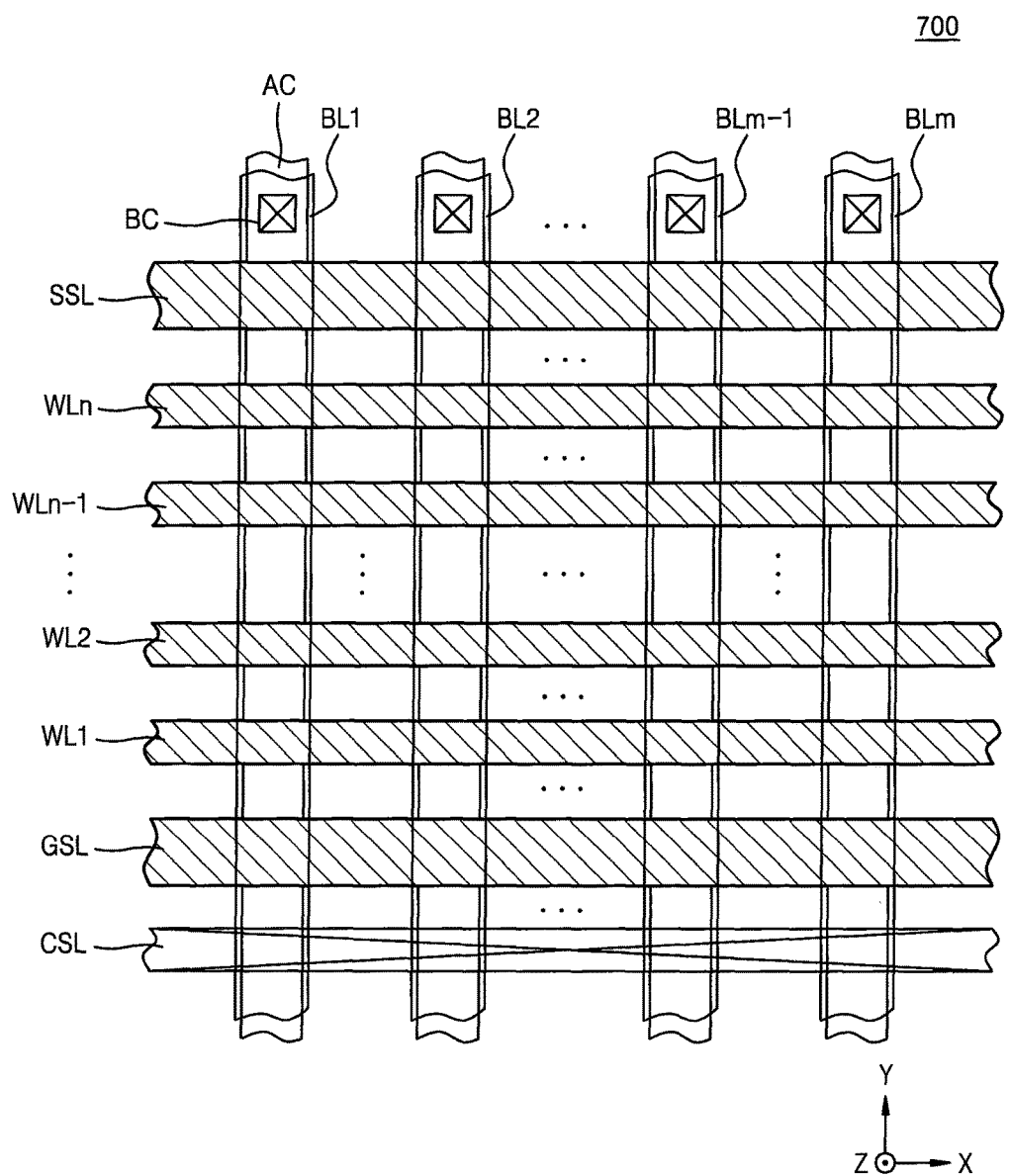
FIGS. 8A and 8B are diagrams illustrating an integrated circuit device and a fabrication method thereof, according to example embodiments of the present inventive concept, and in particular.
Figure 8B:
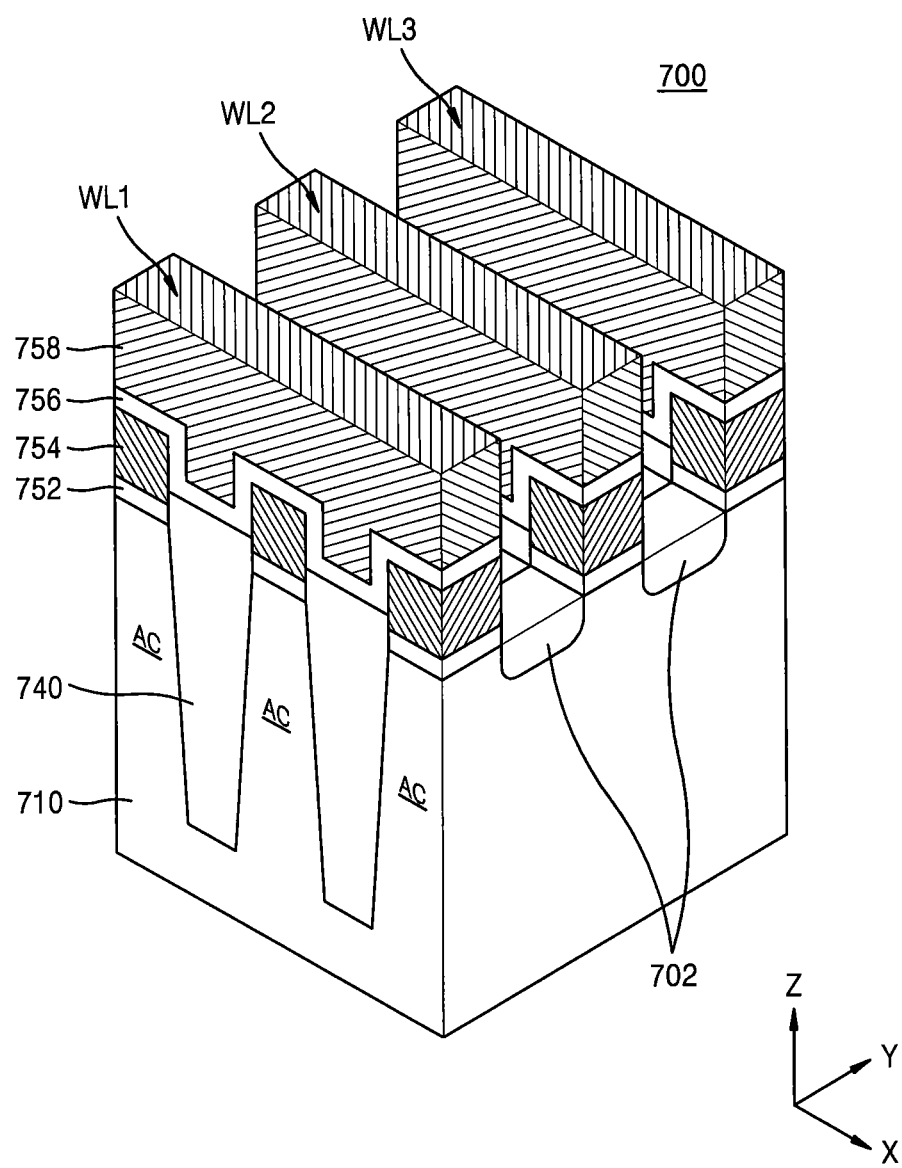

FIGS. 8A and 8B are diagrams illustrating an integrated circuit device and a fabrication method thereof, according to some embodiments of the inventive concept, and in particular, FIG. 8A is a layout of a partial configuration of a memory cell array of a non-volatile memory device, and FIG. 8B is a perspective view of a partial configuration of the memory cell array of the non-volatile memory device.

FIGS. 8A and 8B each illustrate a partial configuration of a memory cell array 700 of a NAND flash memory device, which is an example of a non-volatile memory device. In FIG. 8B, some components of the memory cell array 700 of the NAND flash memory device of FIG. 8A, for example, bit lines, are omitted.

Referring to FIGS. 8A and 8B, the memory cell array 700 may include a plurality of active regions AC which are defined by a plurality of device isolation regions 740 formed in a substrate 710. The substrate 710 may have substantially the same configuration as described regarding the substrate 110 with reference to FIG. 2A. The plurality of active regions AC may include a plurality of line patterns parallel to each other.

A string select line SSL and a ground select line GSL may be located over the plurality of active regions AC while crossing the plurality of active regions AC. A plurality of word lines WL1, WL2, . . . , WLn-1, and WLn may be arranged over the plurality of active regions AC between the string select line SSL and the ground select line GSL while crossing the plurality of active regions AC. The string select line SSL, the ground select line GSL, and the plurality of word lines WL1, WL2, . . . , WLn-1, and WLn may be parallel to each other. In some embodiments, a common source line (CSL) may be adjacent the ground select line GSL, as illustrated in FIG. 8A.

A plurality of impurity regions 702 may be formed in the plurality of active regions AC adjacent to both sides of each of the string select line SSL, the ground select line GSL, and the plurality of word lines WL1, WL2, . . . , WLn-1, and WLn. Thus, a string select transistor, memory cell transistors, and a ground select transistor, which are connected to each other in series, may be formed. The string select transistor, the ground select transistor, and the memory cell transistors therebetween may constitute one unit memory string.

The plurality of active regions AC located adjacent to the string select line SSL and at an opposite side to the ground select line GSL may be defined as a drain region of each string select transistor. In addition, the plurality of active regions AC located adjacent to the ground select line GSL and at an opposite side to the string select line SSL may be defined as a source region of the ground select transistor.

Each of the plurality of word lines WL1, WL2, . . . , WLn-1, and WLn may extend in a direction intersecting the plurality of active regions AC. Each of the plurality of word lines WL1, WL2, . . . , WLn-1, and WLn may include a tunneling insulating layer 752, a charge storage layer 754, a blocking insulating layer 756, and a gate electrode layer 758, which are stacked on the substrate 710 in this stated order.

The tunneling insulating layer 752 and the charge storage layer 754 of each memory cell transistor may be separated from those of a memory cell transistor which is adjacent thereto in an extension direction of the plurality of word lines WL1, WL2, . . . , WLn-1, and WLn.

The tunneling insulating layer 752 may include, for example, silicon oxide, silicon oxynitride, impurity-doped silicon oxide, or a low-K material having a lower dielectric constant than silicon oxide. The charge storage layer 754 may be, for example, a charge trapping layer or a conductive layer. In some embodiments, the charge storage layer 754 may include a doped semiconductor, for example, doped polysilicon. Charge storage layers 754 may be electrically insulated from each other by the tunneling insulating layer 752 and the blocking insulating layer 756.

The blocking insulating layer 756 may be shared by the memory cell transistors adjacent to each other in the extension direction of the plurality of word lines WL1, WL2, . . . , WLn-1, and WLn. The blocking insulating layer 756 may have a stack structure including a silicon oxide film, a silicon nitride film, or combinations thereof. In some embodiments, the blocking insulating layer 756 may include an Oxide-Nitride-Oxide (ONO) film. In some embodiments, the blocking insulating layer 756 may include a high-K material having a higher dielectric constant than silicon oxide.

The gate electrode layer 758 may be an electrode controlling program and erase operations. The gate electrode layer 758 of each memory cell transistor may be formed to be connected to that of a memory cell transistor which is adjacent thereto in the extension direction of the plurality of word lines WL1, WL2, . . . , WLn-1, and WLn. In some embodiments, the gate electrode layer 758 may be a conductive film including, for example, a doped semiconductor, a metal silicide, or combinations thereof. For example, the gate electrode layer 758 may include doped polysilicon.

At least one of the string select line SSL and the ground select line GSL may have a stack structure in an intersection region with each of the plurality of active regions AC, the stack structure being identical to the stack structure of each of the plurality of word lines WL1, WL2, . . . , WLn-1, and WLn. In some embodiments, the charge storage layer 754 may be electrically connected to the gate electrode layer 758. A width of each of the string select line SSL and the ground select line GSL may be greater (e.g., wider) than a width of each of the plurality of word lines WL1, WL2, . . . , WLn-1, and WLn.

The memory cell array 700 may include a plurality of bit lines BL1, BL2, . . . , BLm-1, and BLm over the plurality of word lines WL1, WL2, . . . , WLn-1, and WLn, the plurality of bit lines BL1, BL2, . . . , BLm-1, and BLm crossing the plurality of word lines WL1, WL2, . . . , WLn-1, and WLn. Each of the plurality of bit lines BL1, BL2, . . . , BLm-1, and BLm may be connected to the drain region of the string select line SSL via a bit line contact BC. The plurality of bit lines BL1, BL2, . . . , BLm-1, and BLm may be arranged parallel to the plurality of active regions AC.

The plurality of active regions AC and/or the plurality of word lines WL1, WL2, . . . , WLn-1, and WLn shown in FIGS. 8A and 8B may be formed by methods of fabricating an integrated circuit device according to some embodiments of the present inventive concept (e.g., the methods described with reference to FIGS. 1 through 7B, methods variously modified and changed from the methods described herein without departing from the spirit and scope of the inventive concept.)

Although the non-volatile memory device and the fabrication method thereof have been described with reference to FIGS. 8A and 8B, the inventive concept is not limited thereto, and, by using the methods of fabricating the integrated circuit device according to the inventive concept, various devices including memory devices, such as dynamic random access memory (DRAM) devices, magnetic RAM (MRAM) devices, static RAM (SRAM) devices, phase change RAM (PRAM) devices, resistance RAM (RRAM) devices, and ferroelectric RAM (FRAM) devices, logic devices, and the like may be implemented.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A method of fabricating an integrated circuit device, the method comprising:
    forming a layer on a substrate, the layer comprising a first material;
    forming a pair of sacrificial spacers defining a sacrificial spacer recess between the pair of sacrificial spacers, wherein the sacrificial spacer recess exposes a portion of the layer, and wherein the pair of sacrificial spacers comprise the first material;
    forming a spacer layer comprising a plurality of first portions and a second portion, wherein each of the plurality of first portions of the spacer layer extends on a respective one of sidewalls of the pair of sacrificial spacers, and the second portion of the spacer layer overlaps the portion of the layer, and wherein the spacer layer comprises a second material that is different from the first material;
    forming a protective pattern overlapping the second portion of the spacer layer;
    removing upper portions of the protective pattern, upper portions of the spacer layer, and upper portions of the pair of sacrificial spacers to expose lower portions of the pair of sacrificial spacers;
    removing the lower portions of the pair of sacrificial spacers to expose a plurality of first etch regions of the layer while the protective pattern is overlapping the second portion of the spacer layer;
    removing the protective pattern to expose the second portion of the spacer layer;
    removing the second portion of the spacer layer to form a plurality of spacers and to expose a second etch region of the layer, wherein the plurality of spacers expose a plurality of etch regions of the layer, and the plurality of etch regions of the layer comprise the plurality of first etch regions and the second etch region of the layer; and
    etching the layer by using the plurality of spacers as an etch mask.

2. The method according to claim 1, wherein an upper surface of the protective pattern, an upper surface of the spacer layer, and upper surfaces of the pair of sacrificial spacers are coplanar after removing the upper portions of the protective pattern, the upper portions of the spacer layer, and the upper portions of the pair of sacrificial spacers.

3. The method according to claim 1, wherein forming the pair of sacrificial spacers comprises:
    forming a reference pattern on the layer;
    forming a sacrificial spacer layer conformally extending on both sidewalls of the reference pattern and extending on the layer;
    etching the sacrificial spacer layer to form the pair of sacrificial spacers on a respective one of the both sidewalls of the reference pattern, respectively; and
    removing the reference pattern.

4. The method according to claim 3, wherein the reference pattern comprises a carbon-containing film.

5. The method according to claim 3, wherein the reference pattern has a first thickness, and
    wherein, after removing the upper portions of the protective pattern, the upper portions of the spacer layer, and the upper portions of the pair of sacrificial spacers, the spacer layer has a second thickness that is thinner than the first thickness.

6. The method according to claim 3, wherein the reference pattern and the protective pattern comprise the same material.

7. The method according to claim 1, wherein the plurality of spacers comprise a plurality of first spacers and a plurality of second spacers, and one of the plurality of first spacers has a first thickness different from a second thickness of one of the plurality of second spacers, and
    wherein bottom surfaces of the plurality of second spacers are closer to the substrate than bottom surfaces of the plurality of first spacers.

8. A method of fabricating an integrated circuit device, the method comprising:
    forming a layer on a substrate;
    forming a plurality of sacrificial spacers on the layer, wherein the plurality of sacrificial spacers expose a plurality of portions of the layer;
    forming a spacer layer comprising a plurality of first portions and a plurality of second portions, wherein each of the plurality of first portions extends on a respective one of sidewalls of the plurality of sacrificial spacers, and each of the plurality of second portions overlaps one of the plurality of portions of the layer, and wherein the spacer layer defines a plurality of spacer layer recesses, and one of the plurality of spacer layer recesses is between two adjacent ones of the plurality of sacrificial spacers;
    forming a plurality of protective patterns in the plurality of spacer layer recesses, respectively, wherein each of the plurality of protective patterns overlaps a respective one of the plurality of second portions of the spacer layer;

removing upper portions of the spacer layer to expose the plurality of sacrificial spacers while the plurality of protective patterns is overlapping the plurality of second portions of the spacer layer, respectively;

removing the plurality of sacrificial spacers to expose a plurality of first etch regions of the layer;

removing the plurality of protective patterns to expose the plurality of second portions of the spacer layer;

removing the plurality of second portions of the spacer layer to expose a plurality of second etch regions of the layer to form a plurality of spacers, wherein the plurality of second etch regions are spaced apart from the plurality of first etch regions, and each of the plurality of spacers comprises a portion of a respective one of the plurality of first portions of the spacer layer; and etching the plurality of first etch regions and the plurality of second etch regions of the layer by using the plurality of spacers as an etch mask.

9. The method according to claim 8, wherein each of the plurality of sacrificial spacers comprises a material included in the layer and contacts the layer.

10. The method according to claim 8, wherein forming the plurality of protective patterns comprises:

forming a protective film on the spacer layer, wherein the protective film comprises a plurality of portions in the plurality of spacer layer recesses, respectively, and has a flat upper surface; and removing an upper portion of the protective film to separate the plurality of portions of the protective film from each other.

11. The method according to claim 8, wherein each of the plurality of protective patterns comprises a carbon-containing film, and wherein removing the plurality of protective patterns comprises ashing and stripping the carbon-containing film.

12. The method according to claim 8, wherein forming the plurality of sacrificial spacers comprises:

forming a plurality of reference patterns on the layer;

forming a sacrificial spacer layer conformally extending on both sidewalls of the plurality of reference patterns and conformally extending on the layer;

etching the sacrificial spacer layer to form the plurality of sacrificial spacers; and removing the plurality of reference patterns to expose the plurality of portions of the layer through the plurality of spacer layer recesses.

13. The method according to claim 12, wherein each of the plurality of reference patterns comprises a stack structure comprising a carbon-containing film and a nitride film.

14. The method according to claim 12, wherein each of the plurality of sacrificial spacers has a first width in a first horizontal direction, wherein each of the plurality of reference patterns has a second width in the first horizontal direction, and the second width is at least three times the first width, and wherein a gap between the plurality of reference patterns has a third width in the first horizontal direction, and the third width is at least six times the first width.

15. A method of fabricating an integrated circuit device, the method comprising:

forming a layer on a substrate, wherein the layer comprises a first portion formed on a first region of the substrate and a second portion formed on a second region of the substrate, and wherein the layer comprises a first material;

forming a blocking film extending on the second portion of the layer;

forming a plurality of sacrificial spacers on the first portion of the layer and a first covering layer on the second portion of the layer, wherein the plurality of sacrificial spacers are spaced apart from each other and define a plurality of sacrificial spacer recesses exposing a plurality of exposed portions of the layer, respectively, wherein the plurality of sacrificial spacers comprise the first material, and wherein the first covering layer extends on at least a portion of the blocking film and comprises the first material;

forming a spacer layer on the first portion of the layer and a second covering layer on the second portion of the layer, wherein the spacer layer comprises a plurality of first portions and a plurality of second portions, wherein each of the plurality of first portions of the spacer layer extends on a respective one of sidewalls of the plurality of sacrificial spacers, and each of the plurality of second portions of the spacer layer overlaps a respective one of the plurality of exposed portions of the layer, wherein the spacer layer defines a plurality of spacer layer recesses between two adjacent ones of the plurality of sacrificial spacers, and wherein the second covering layer extends on at least a portion of the first covering layer;

forming a plurality of protective patterns in the plurality of spacer layer recesses, respectively, wherein one of the plurality of protective patterns overlaps one of the plurality of second portions of the spacer layer;

removing upper portions of the spacer layer while the plurality of protective patterns is overlapping the plurality of second portions of the spacer layer;

removing the plurality of sacrificial spacers to expose a plurality of first etch regions of the layer;

removing the plurality of protective patterns to expose the plurality of second portions of the spacer layer;

removing the plurality of second portions of the spacer layer to expose a plurality of second etch regions of the layer and to form a plurality of spacers, wherein the plurality of second etch regions are spaced apart from the plurality of first etch regions, and the plurality of spacers comprise portions of the plurality of first portions of the spacer layer, respectively; and etching the plurality of first etch regions and the plurality of second etch regions of the layer to form a plurality of patterns in the first region of the layer using the plurality of spacers as an etch mask while the blocking film is overlapping the second region of the layer.

16. The method according to claim 15, further comprising, while removing the upper portions of the spacer layer, exposing the blocking film by removing the second covering layer and the first covering layer formed on the second region of the substrate.

17. The method according to claim 15, further comprising:

while forming the blocking film, forming a plurality of reference patterns on the first portion of the layer, the plurality of reference patterns each comprising the same material as the blocking film, wherein forming the plurality of sacrificial spacers and the first covering layer comprises:

forming a sacrificial spacer layer comprising the first material, the sacrificial spacer layer extending on the layer and the blocking film and extending on opposing sidewalls of the plurality of reference patterns; and performing an etch-back process on the sacrificial spacer layer to form the plurality of sacrificial spacers on the first region of the substrate and to form the first covering layer on the second region of the substrate, wherein the plurality of sacrificial spacers comprises a plurality of first portions of the sacrificial spacer layer, respectively, and the first covering layer comprises a second portion of the sacrificial spacer layer while the blocking film is extending on the second portion of the layer.

18. The method according to claim 15, wherein removing the upper portions of the spacer layer further comprises removing upper portions of the plurality of protective patterns until a top surface of the spacer layer and top surfaces of the plurality of protective patterns are at a first level that is lower than a second level of a top surface of the blocking film.

19. The method according to claim 15, wherein, after forming the plurality of spacers, the blocking film comprises a top surface at a first level, and each of the plurality of spacers and the plurality of protective patterns has a top surface at a second level that is lower than the first level.

20. The method according to claim 15, further comprising:
   before forming the plurality of patterns, forming an etching target film on the substrate; and
   after forming the plurality of patterns, forming a plurality of fine patterns by etching the etching target film by using the plurality of patterns as an etch mask.

* * * * *